(12) United States Patent
Fukuyoshi et al.

(10) Patent No.: US 7,084,472 B2
(45) Date of Patent: Aug. 1, 2006

(54) SOLID-STATE IMAGING DEVICE AND MANUFACTURING METHOD THEREFOR

(75) Inventors: Kenzo Fukuyoshi, Tokyo (JP); Tadashi Ishimatsu, Tokyo (JP); Satoshi Kitamura, Tokyo (JP); Keisuke Ogata, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 0 days.

(21) Appl. No.: 10/813,179

(22) Filed: Mar. 31, 2004

(65) Prior Publication Data

US 2004/0185588 A1    Sep. 23, 2004

Related U.S. Application Data

(63) Continuation of application No. PCT/JP03/08705, filed on Jul. 9, 2003.

(30) Foreign Application Priority Data

| Jul. 9, 2002 | (JP) | ............................. 2002-199558 |
| Dec. 18, 2002 | (JP) | ............................. 2000-366318 |
| Jan. 24, 2003 | (JP) | ............................. 2003-015777 |
| Jan. 31, 2003 | (JP) | ............................. 2003-023297 |
| May 2, 2003 | (JP) | ............................. 2003-126929 |

(51) Int. Cl.
*H01L 31/0232* (2006.01)
*H01L 31/0203* (2006.01)

(52) U.S. Cl. ................... 257/432; 257/440; 257/443; 313/498; 313/506

(58) Field of Classification Search ............... 313/498, 313/110, 506; 257/88, 98, 99, 213, 222, 257/432, 433, 440, 443; 250/208.1
See application file for complete search history.

(56) References Cited

U.S. PATENT DOCUMENTS

| 4,667,092 A | * | 5/1987 | Ishihara ....................... 250/216 |
| 5,466,926 A | * | 11/1995 | Sasano et al. ............... 250/216 |
| 6,831,311 B1 | * | 12/2004 | Uchida ....................... 257/290 |

FOREIGN PATENT DOCUMENTS

| JP | 5-48057 | 2/1993 |
| JP | 5-326902 | 12/1993 |
| JP | 6-132505 | 5/1994 |
| JP | 7-46612 | 2/1995 |
| JP | 8-211336 | 8/1996 |
| JP | 10-326885 | 12/1998 |
| JP | 11-317511 | 11/1999 |
| JP | 2000-193819 | 7/2000 |
| JP | 2001-358320 | 12/2001 |
| JP | 2002-110952 | 4/2002 |

* cited by examiner

*Primary Examiner*—Joseph Williams
*Assistant Examiner*—Peter Macchiarolo

(57) ABSTRACT

A solid-state imaging device includes a plurality of two-dimensionally arranged photo diodes and a plurality of microlenses having substantially hemispherical shapes which cover the respective photo diodes. The microlens has a multilayer structure including at least a transparent resin upper layer which forms at least a portion of the substantially hemispherical shape, and a colored lower layer provided on a portion of the transparent resin upper layer which is located above the photo diode, with an interface between the colored lower layer and the transparent resin upper layer having a shape conforming to a surface of the photo diode.

17 Claims, 10 Drawing Sheets

SOLID-STATE IMAGING DEVICE AND MANUFACTURING METHOD THEREFOR

CROSS-REFERENCE TO RELATED APPLICATIONS

This is a Continuation Application of PCT Application No. PCT/JP03/08705, filed Jul. 9, 2003, which was not published under PCT Article 21 (2) in English.

This application is based upon and claims the benefit of priority from prior Japanese Patent Applications No. 2002-199558, filed Jul. 9, 2002; and No. 2003-023297, filed Jan. 31, 2003, the entire contents of both of which are incorporated herein by reference.

BACKGROUND OF THE INVENTION

1. Field of the Invention

The present invention relates to a solid-state imaging element typified by a light-receiving device such as a C-MOS or CCD.

2. Description of the Related Art

An area (opening portion) on a solid-state imaging device such as a CCD in which photo diodes contribute to photoelectric conversion is limited to about 20 to 40% of the total area of the solid-state imaging device, although it depends on the size and the number of pixels of the solid-state imaging device. A small opening portion directly leads to low sensitivity. In order to compensate for it, a microlens for condensing light is generally formed on a photo diode.

Recently, however, strong demands have arisen for a solid-state imaging device having a high resolution of over 3,000,000 pixels. Serious problems have been posed in terms of a reduction in the open area ratio (i.e., a reduction in the sensitivity) of a microlens attached to this high-resolution solid-state imaging device and image quality deterioration due to an increase in noise such as flare and smear. Imaging devices such as C-MOSs and CCDs have almost reached a sufficient number of pixels. Competition for the number of pixels among device makers is now changing to competition for image quality.

A known technique associated with a technique of forming microlenses is disclosed relatively in detail in, for example, Jpn. Pat. Appln. KOKAI Publication No. 60-53073. This reference discloses, in detail, a technique using the heat flow properties (heat flow) of a resin due to heat as a technique of forming a lens into a hemispherical shape and a technique of processing a lens by several etching methods. The reference also discloses, as measures against the loss of the light condensing performance of a lens surface due to light scattering, a technique of forming, on the lens surface, an organic film such as a poly(glycidylmethacrylate) (PGMA) film or an inorganic film made of OCD (an $SiO_2$-based film formation coating solution available from Tokyo Ohka Kogyo Co., Ltd.) and the like.

A technique of forming a single-layer or multilayer antireflection film on a microlens to prevent reflection by the microlens is also disclosed in, for example, Jpn. Pat. Appln. KOKAI Publication No. 4-223371. In addition, a technique of dry-etching a microlens other than the above techniques is disclosed in detail in Jpn. Pat. Appln. KOKAI Publication No. 1-10666. Furthermore, a technique for chromatic microlenses (colored microlenses) is disclosed in, for example, Jpn. Pat. Appln. KOKAI Publication Nos. 64-7562 and 3-230101.

FIG. 1A is a sectional view of a typical conventional solid-state imaging device. As shown in FIG. 1A, for example, planarized layers 81 and 82, a color filter 83, and if circumstances require, an inner-layer lens are formed on a photo diode 80. As consequence, in general, an under-lens distance D1 is about 5 to 6 µm, which is relatively large (relatively thick).

FIG. 1B is a sectional view of another conventional solid-state imaging device (having chromatic lenses 90). The arrangement of the solid-state imaging device can be simplified by each chromatic lens 90 having a color filter function.

The conventional solid-state imaging devices, however, have, for example, the following problems.

First, the arrangements of the conventional solid-state imaging devices have difficulty in reducing under-lens distances. More specifically, referring to FIG. 1A, reducing (thinning) the under-lens distance D1 is a promising means for improving the condensing performance with respect to incident light from microlenses 85 and also increasing the S/N (signal-to-noise) ratio in the photo diodes 80. If, however, the thickness of each microlens 85 (lens height D2) is simply reduced, it is difficult to form a microlens into a substantially hemispherical shape by using the method of manufacturing microlenses by heat flow. Therefore, a suitable microlens cannot be manufactured.

This problem is especially obvious in a C-MOS imaging device, which has recently attracted a great deal of attention because it consumes low power and is integrated with a driving circuit to realize space saving. This is because in a C-MOS imaging device, the distance from a microlens to a photo diode tends to be large owing to its structure, and hence this arrangement is disadvantageous in reducing the Second, with the conventional arrangement, color purity degrades to cause a deterioration in image quality depending on the incident position of light. More specifically, referring to FIG. 1B, light L1 incident near the center of the chromatic lens 90 is transmitted through a portion of the chromatic lens which has a sufficient thickness, and hence an almost intended color filter effect can be expected for transmitted light L3. In contrast to this, light L2 incident from an end portion of the chromatic lens 90 is transmitted through a thin portion of the chromatic lens serving as a color filter, and hence transmitted light L4 becomes considerably whitish. As a result, the color purity greatly degrades.

BRIEF SUMMARY OF THE INVENTION

The present invention has been made in consideration of the above situation, and has as its object to provide a solid-state imaging device which can improve the light condensing performance and S/N ratio by reducing the under-lens distance, set the substantial thickness of each microlens to 0.5 µm or more, and improve the open area ratio by suppressing degradation in the color purity of each chromatic lens, and a manufacturing method for the device.

According to a first aspect of the present invention, there is provided a solid-state imaging device comprising a plurality of two-dimensionally arranged photo diodes and a plurality of microlenses having substantially hemispherical shapes which cover the respective photo diodes, each microlens comprising a multilayer structure lens including at least a transparent resin upper layer which forms at least a portion of the substantially hemispherical shape, and a colored lower layer provided on a portion of the transparent resin upper layer, which is located above the photo diode, with an interface between the colored lower layer and the transparent resin upper layer having a shape conforming to a surface of the photo diode.

According to a second aspect of the present invention, there is provided a solid-state imaging device manufacturing method for a solid-state imaging device comprising a plurality of two-dimensionally arranged photo diodes and a plurality of microlenses having substantially hemispherical shapes which cover the respective photo diodes, comprising forming a planarized layer on a plurality of photo diodes two-dimensionally arranged on a semiconductor substrate, forming colored lower layers in a plurality of colors on the planarized layer by photolithography using photosensitive colored resists containing coloring matters as coloring materials, forming transparent resin upper layers on the plurality of colored lower layers by coating a first resin coating solution, forming a lens matrix on the transparent resin upper layer by photolithography and annealing using a lens material having alkali solubility, photosensitivity, and heat flow properties, and transferring a pattern of the lens matrix onto at least the transparent resin upper layer by performing dry etching on the lens matrix, and forming the microlens having at least the transparent resin upper layer and the colored lower layer.

DETAILED DESCRIPTION OF THE INVENTION

Figure 1A:
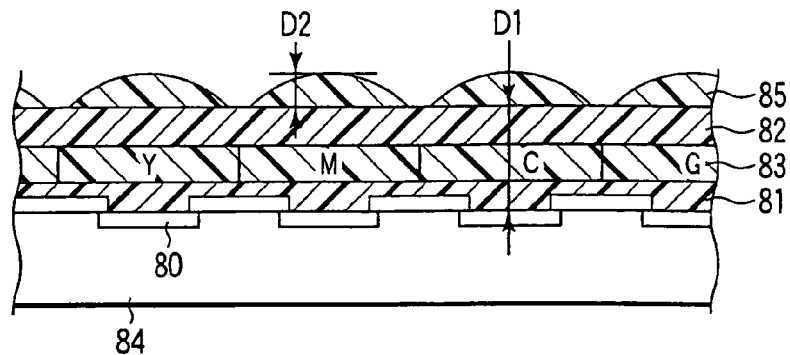
FIG. 1A is a sectional view showing a conventional typical solid-state imaging device.

Each embodiment of the present invention will be described below with reference to the views of the accompanying drawing. Note that the same reference numerals denote constituent elements having substantially the same functions and arrangements throughout the following description, and repetitive descriptions will be made only when required.

(First Embodiment)

Figure 1B:
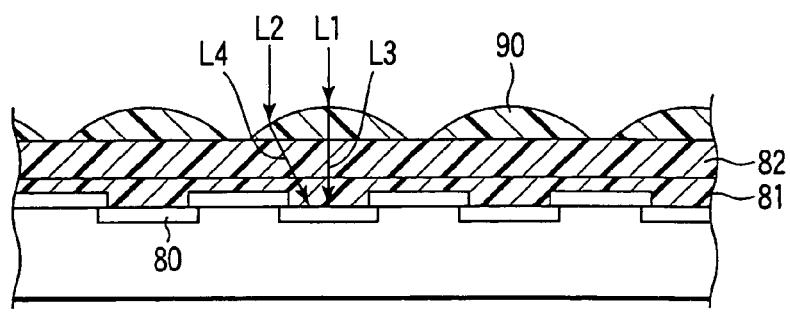
FIG. 1B is a sectional view showing another conventional solid-state imaging device (having chromatic lenses 90)
Figure 2A:
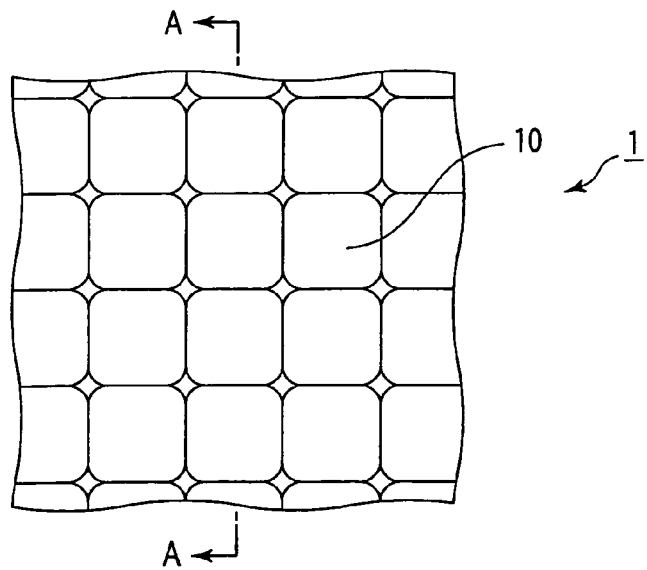
FIG. 2A is a top view of a solid-state imaging device 1 according to the first embodiment.
Figure 2B:
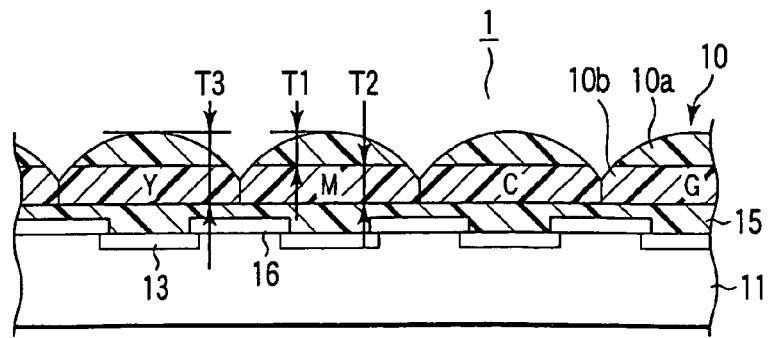
FIG. 2B is a sectional view taken along a line A—A in FIG. 2A.

FIG. 2A is a top view of a solid-state imaging device 1 according to the first embodiment. FIG. 2B is a sectional view taken along a line A—A in FIG. 1. The arrangement of the solid-state imaging device 1 will be described first with reference to FIGS. 2A and 2B.

As shown in FIGS. 2A and 2B, the solid-state imaging device 1 includes microlenses 10, a semiconductor substrate 11, photo diodes 13, light-shielding layers 16, and a planarized layer 15.

The semiconductor substrate 11 is a substrate for mounting the photo diodes 13 and the like. The photo diode 13 converts light incident through the microlens 10 into an electric charge. The planarized layer 15 planarizes the mount surface for the microlenses 10.

The microlens 10 is hemispherical and has a hemispherical transparent resin upper layer 10a which forms the upper portion of the microlens 10 and a colored lower layer 10b which forms the bottom portion of the microlens 10. The boundary between the transparent resin upper layer 10a and the colored lower layer 10b has a shape conforming to the surface of the photo diode 13, i.e., a flat shape. The area of this flat surface corresponds to part of the effective area (the surface having a condensing function) of the colored lower layer 10b. In the case shown in FIG. 2B, part of the colored lower layer 10b forms part of the hemispherical shape of the microlens 10, as shown in FIG. 2B. As described above, the colored lower layer 10b preferably forms part of the hemispherical shape of the microlens 10.

The thickness T1 of the transparent resin upper layer 10a is not specifically defined, but is preferably 0.4 μm or more, which is the lower limit of thickness in heat flow. The upper limit of the thickness T1 of the transparent resin upper layer 10a is preferably about 1 μm because this embodiment is directed to a fine pixel pitch.

The thickness T2 of the colored lower layer 10b suffices if it corresponds to a color filter film thickness necessary for intended color separation, and is not specifically limited. In general, it suffices if this thickness falls within the range of 0.5 μm to 1.5 μm. The flat interface between the colored lower layer 10b and the transparent resin upper layer 10a is preferably as large as possible within the range permitted in terms of pixel size in consideration of color separation.

Although the colored lower layer 10b may be colored by using an organic pigment as a coloring material, the layer is preferably colored with a dye (the coloring material means materials including coloring agents). For example, the following are the reasons for this. If organic pigments are used, etching rates in dry etching vary depending on the types of pigments used, and hence lens shapes tend to vary for the respective colors. The surfaces become rough. In an imaging device with a fine pixel pitch to which this embodiment is directed, the particle size (particle) of a pigment itself is likely to affect the S/N ratio, and it is difficult to perform filtration (foreign substance removal) of the coloring resist material.

When a colored layer containing an organic pigment as a coloring material is etched deeply, its surface becomes considerably rough. When part of the colored lower layer which has become the rough surface is formed into a microlens, it is difficult to hold the microlens shape. If colored lower layers in the respective colors before etching vary in thickness, final thickness adjustment is done in a dry etching step. Inevitably, the thickness of a colored lower layer to be dry-etched is increased. In order to make the roughness of etched surfaces fall within an allowable range, the differences in thickness between colored lower layers in the respective colors may be made to fall within 0.3 μm. As the differences in thickness between these color lower layers increase, microlenses with better lens shapes can be obtained.

The reflective index difference between the transparent resin upper layer 10a and the colored lower layer 10b is preferably as small as possible to minimize a reduction in the amount of light incident on the photo diode. In addition, the refractive index of the transparent resin upper layer 10a is preferably as low as possible to reduce its surface reflection. In consideration of these points, a thin optical film for the reduction of reflection may be inserted in the interface between the transparent resin upper layer 10a and the colored lower layer 10b. In this case, although the interface between the transparent resin upper layer 10a and the thin optical film need not be flat, the interface between the thin optical film and the colored lower layer 10b needs to be flat. Alternatively, an antireflection film may be stacked on the entire surface of the microlens 10. Considering as well that the transparent resin upper layer 10a having a low refractive index can be formed thicker than that having a high refractive index, an arrangement in which an antireflection film is stacked is preferable for the solid-state imaging device 1 having fine pixels.

The microlenses 10 are formed by dry etching using a lens matrix. In this dry etching using the lens matrix, etching tends to speed up relatively in the recess portions between the lenses, resulting in a deterioration in the finished shape of each microlens. In order to reduce this deterioration, the entire lens matrix is preferably covered with a thin transparent resin layer having a thickness of about 0.05 μm to 0.3 μm before dry etching. Inserting this step can execute lens matrix transfer more smoothly.

In manufacturing the solid-state imaging device 1, in order to reduce the under-lens distance, the dry etching depth is set to be as large as possible. In this case, if etching proceeds to the underlying layer (i.e., the planarized layer 15) of the colored lower layer, the planarized surface (effective area) of the colored lower layer decreases. Consequently, the amount of light which has reduced color purity and is incident from a bottom portion of the microlens increases, resulting in a deterioration in image quality. For this reason, the dry etching depth is preferably made to correspond to a midway position in the colored lower layer in the direction of thickness. If a portion of the colored lower layer is left unetched by a thickness of about 0.4 μm, more preferably 0.7 μm, deterioration of color purity can be suppressed.

In general, $O_2$ gas is used for dry etching. If a reducing flon-based gas is used as an etching gas, since lens matrices can be transferred with narrow gaps, a lens shape can be easily ensured. Flon-based gases that can be used include $CF_4$, $C_2F_6$, $C_3F_8$, $C_4F_8$, $CHF_3$, $C_2HF_5$, and the like. These gases can be used singly or in combination. Increasing the ratio of C or H with respect to F is effective in holding narrow gaps. More specifically, a gas mixture containing $CF_4$ as a basic gas with a small amount of $C_3F_8$, $C_4F_8$, or the like added is preferably used. Note, however, that the composition of an etching gas greatly depends on the dry etching apparatus used in order to obtain an optimal lens shape or inter-lens gaps. Therefore, the gas composition is not limited to any specific one.

If the transparent resin upper layer 10a is made of an acrylic-based resin, a photosensitive colored resist resin is preferably an acrylic-based photosensitive resin in consideration of adhesive force, refractive index, and the like. A dye may be used in a dissolved form into the prime solvent of a photosensitive colored resist, in a dispersed form, or an embedded form in a resin skeleton, i.e., a so-called pendant form.

Note that a general dyeing method using a dye bath is not preferable in terms of cost because of an increase in the number of steps. A color filter using a dye as a coloring material can perform high filtration (foreign substance removal) of 0.2 μm to 0.1 μm in the stage of a colored resist, and hence an imaging device having high image quality and greatly increased S/N ratio can be obtained as compared with the case wherein a colored resist dispersed with an organic pigment whose filtration is limited to 1 μm to 0.5 μm is used.

Dyes that can be used include azo-based dyes, xanthenium-based dyes, phthalocyanine-based dyes, anthraquinone-based dyes, coumarin-based dyes, styryl-based dyes, and the like. Primary color dyes, i.e., red, green, and blue dyes, complementary color dyes, i.e., cyan, magenta, and yellow dyes, and dyes obtained by adding a green dye to them can be used.

EXAMPLE 1 OF MANUFACTURING METHOD

A method of manufacturing the solid-state imaging device 1 will be described in detail next.

Figure 3A:
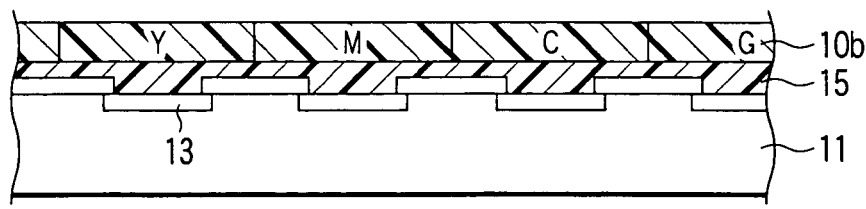
FIGS. 3A to 3C are views for explaining a method of manufacturing the solid-state imaging device 1.
Figure 3B:
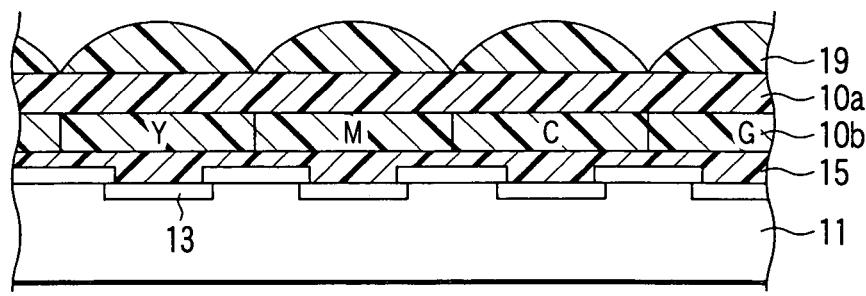
Figure 3C:
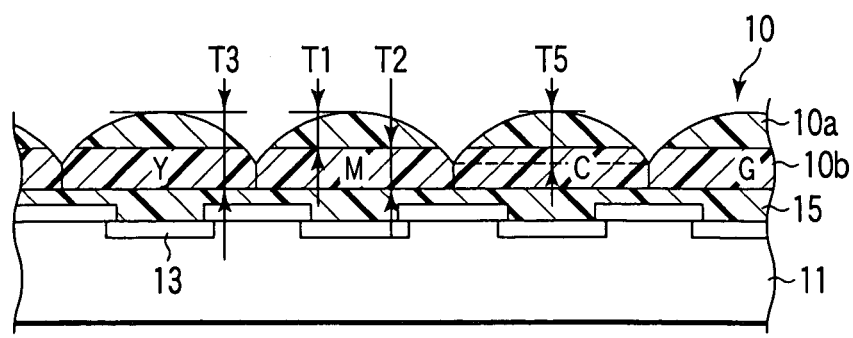

FIGS. 3A to 3C are views for explaining a method of manufacturing the solid-state imaging device 1.

As shown in FIG. 3A, a planarized layer 15 is formed on a semiconductor substrate 11, on which photo diodes 13, light-shielding films, and passivations (both of which are not shown) are formed, by spin coating using a thermosetting acrylic resin coating solution. In addition, colored lower layers 10b are formed using R (red), G (Green), and B (Blue) photosensitive colored resists by performing photolithography three times. The respective photosensitive colored resists in R (Red), G (Green), and B (Blue) are coated by spin coating, and exposure is performed by using a stepper exposure apparatus.

As shown in FIG. 3B, a transparent resin upper layer 10a is formed on the R (red), G (Green), and B (Blue) colored lower layer 10b by spin coating using a thermosetting acrylic resin coating solution.

The transparent resin upper layer 10a is coated with a photosensitive acrylic-based resin having heat flow properties by spin coating, and hemispherical lens matrices 19 are formed by exposure, development, and heat flow. The temperature in a heat flow process is set to, for example, 190° C. Thereafter, the entire upper surface of the lens matrix 19 is coated with the same acrylic-based resin coating solution as that used for the formation of the transparent resin upper layer 10a such that the resultant layer has a thickness of about 0.1 μm after drying, thus forming a thin transparent resin layer (not shown).

The semiconductor substrate 11 on which the lens matrix 19 is formed is etched by a dry etching apparatus using $O_2$ gas. This etching process is executed at a substrate temperature of room temperature, a pressure of 5 Pa, an RF power of 500 W, and a bias of 100 W to obtain the solid-state imaging device 1 having the shape shown in FIG. 3C. Note that an antireflection film may be stacked on the formed microlens 10.

In the above manufacturing, as resin materials for the transparent resin upper layer 10a, colored lower layer 10b, and planarized layer 15, acrylic resins which have almost the same refractive index in the refractive index range of 1.51 to 1.55 at a light wavelength of 550 nm are used. It is relatively difficult to accurately measure the refractive index of the colored lower layer 10b due to the coloring materials contained in the layer. However, the refractive index of an R (red) portion is 1.61 at 700 nm (R (red) exhibits large absorption with respect to 500-nm green light, and hence it is difficult to accurately measure a refractive index at 550 nm).

The R (red), G (Green), and B (Blue) colored lower layers 10b are formed by using acrylic-based photosensitive colored resists obtained by preparing coloring materials mainly including dyes represented by color indices, C.I. Acid Red 114, C.I. Acid Green 16, and C.I. Acid Blue 896, together with acrylic-based resins, and a cyclohexane solvent. The amount of coloring material added is about 20% in terms of solid content ratio in each resist.

As shown in FIG. 3C, the solid-state imaging device 1 obtained by such a manufacturing method is designed such that the microlens 10 constituted by the photo diode 13, colored lower layer 10b, and transparent resin upper layer 10a is formed on the semiconductor substrate 11. According to the experiment conducted by the present inventors, the peak thickness (the thickness of the central portion) T1 of the transparent resin upper layer 10a of the obtained solid-state imaging device 1 was 0.6 μm, and a thickness T5 of the microlens 10, which is the sum of the peak thickness and the depth of the notched portion of the colored lower layer 10b in the form of a lens, was about 1.1 μm. The thickness T2 of the colored lower layer 10b alone was 0.9 μm. The under-lens distance (the distance from the colored lower layer 10b to the photo diode 13) was about 3.4 μm. The under-lens distance in the prior art is 5.5 μm. This distance in the solid-state imaging device 1 could be greatly reduced to about 60% of that in the prior art. In this embodiment, the microlens pitch was 3.5 μm, and the inter-lens gap was 0.3 μm.

EXAMPLE 2 OF MANUFACTURING METHOD

Another method of manufacturing the solid-state imaging device 1 will be described in detail next.

The solid-state imaging device 1 was manufactured by the same method as that in Example 1 described above except that dry etching was performed by using a dry etching gas constituted by 80% $CF_4$ gas and 20% $C_3F_8$ gas instead of $O_2$ gas.

As shown in FIG. 3C, the solid-state imaging device 1 obtained by such a manufacturing method is designed such that a microlens 10 constituted by a photo diode 13, colored lower layer 10b, and transparent resin upper layer 10a is formed on a semiconductor substrate 11. According to the experiment conducted by the present inventors, the peak thickness (the thickness of the central portion) T1 of the transparent resin upper layer 10a of the obtained solid-state imaging device 1 was 0.4 μm, and the thickness T5 of the microlens 10, which is the sum of the peak thickness and the depth of the notched portion of the colored lower layer 10b in the form of a lens, was about 0.6 μm. The thickness T2 of the colored lower layer 10b alone was 0.8 μm. The under-lens distance (the distance from the colored lower layer 10b to the photo diode 13) was about 2.5 μm. The under-lens distance in the prior art is 5.5 μm. This distance in the solid-state imaging device 1 could be greatly reduced to about 45% of that in the prior art. In this example, the microlens pitch was 2.7 μm, and the inter-lens gap was 0.05 μm.

As described above, the solid-state imaging device 1 and its manufacturing method according to this example can obtain at least any one of the following effects.

First, the under-lens distance can be reduced, and hence the light condensing performance and S/N ratio can be improved for the following reason. The solid-state imaging device 1 has at least a two-layer structure constituted by the transparent resin upper layer 10a and colored lower layer 10b, and includes the microlens 10 in which the interface between the transparent resin upper layer 10a and the colored lower layer 10b conforms to the surface shape of the photo diode 13 (conforms to the horizontal shape in this embodiment). Therefore, the layer formed under the lens can be minimized by incorporating the colored lower layer 10b in the microlens 10.

Second, even a solid-state imaging device with a small pixel can be easily processed. This is because the solid-state imaging device 1 allows the microlens 10 to have a substantial thickness of 0.5 μm or more by reducing the under-lens distance, and this thickness allows easy formation of a hemispherical lens shape by heat flow.

According to the experiment conducted by the present inventors, it was very difficult to form a lens shape with a thickness of 0.4 μm or less. In the case of a pixel pitch of 3 μm, the limit thickness of a microlens was 0.4 μm in consideration of mass productivity. When the thickness was 0.3 μm, a microlens was formed into a trapezoidal shape instead of a substantially hemispherical shape. In contrast to this, when the substantial thickness of the microlens 10 was set to 0.5 μm or more as in this solid-state imaging device, a substantially hemispherical shape could be easily formed.

Third, degradation in the color purity of a chromatic lens can be suppressed to increase the open area ratio. This is because the interface between the colored lower layer 10b and the transparent resin upper layer 10a of the solid-state imaging device 1 conforms to the surface shape of the photo diode 13 (conforms to the horizontal shape in this embodiment), and hence the effective area of the colored lower layer 10b is larger than that in the prior art.

Fourth, a solid-state imaging device in which the under-lens distance is small to have improved light condensing performance and S/N ratio, and degradation in the color purity of a chromatic lens is suppressed to increase the open area ratio can be easily manufactured even with a small pixel pitch. This is because this solid-state imaging device manufacturing method includes a step of forming colored lower layers in a plurality of colors on photo diodes, a step of forming a transparent resin upper layer on the colored lower layers in the plurality of colors, a step of forming lens matrices on the transparent resin upper layer, and a step of performing dry etching on the lens matrices to transfer a lens matrix pattern onto the transparent resin upper layers and colored lower layers.

(Second Embodiment)

Figure 4:
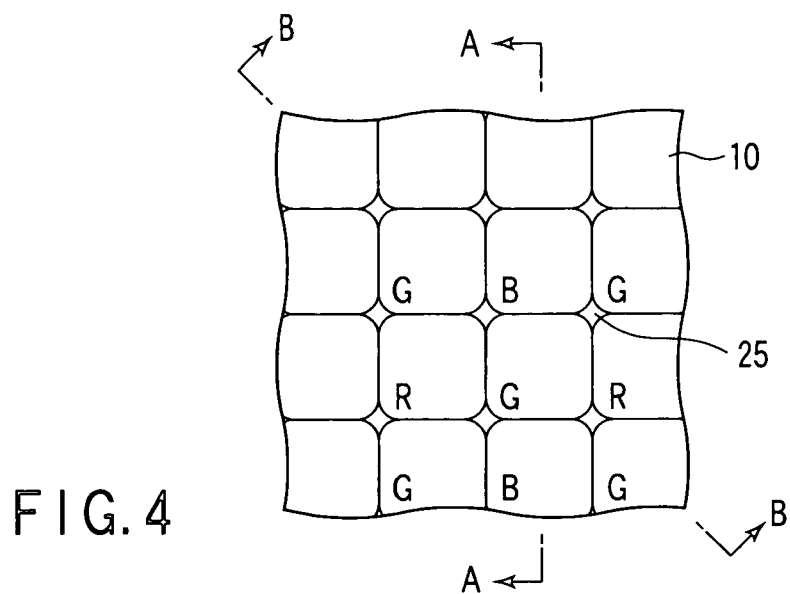
FIG. 4 is a top view of a solid-state imaging device according to the second or third embodiment viewed from the microlens side, and also is a view showing a two-dimensional (planar) arrangement of colored lower layers and microlenses in the Beyer arrangement.
Figure 5A:
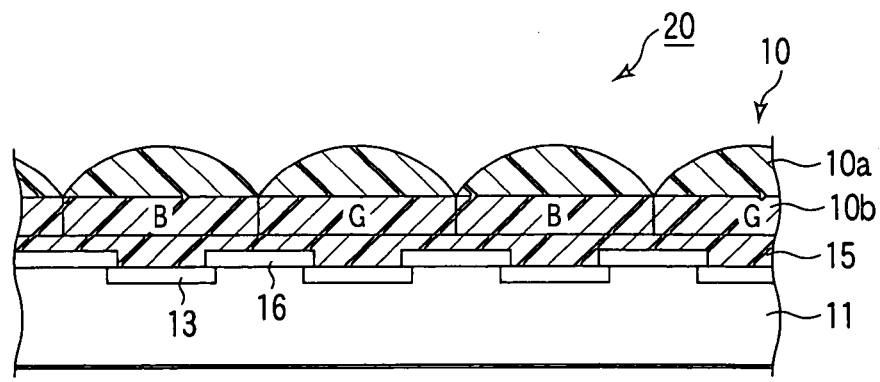
FIG. 5A is a sectional view taken along a line A—A of a solid-state imaging device 20 in FIG. 4.

FIG. 4 is a top view of a solid-state imaging device 20 according to the second embodiment. FIG. 5A is a sectional view taken along a line A—A of the solid-state imaging device 20 in FIG. 4. As shown in FIG. 5A, the solid-state imaging device 20 includes a semiconductor substrate 11, photo diodes 13, microlenses 10, light-shielding layers 16, and a planarized layer 15.

The microlens 10 has a transparent resin upper layer 10a and colored lower layer 10b. An infrared absorbing function can be added to the transparent resin upper layer 10a and planarized layer 15. In general, an infrared cut filter having a thickness of about 2 mm is inserted in the optical system of a solid-state imaging device for a digital camera or cell phone. If, however, an infrared absorbing function is added to the transparent resin upper layer 10a or planarized layer 15, the infrared cut filter can be removed from the optical system.

Figure 5B:
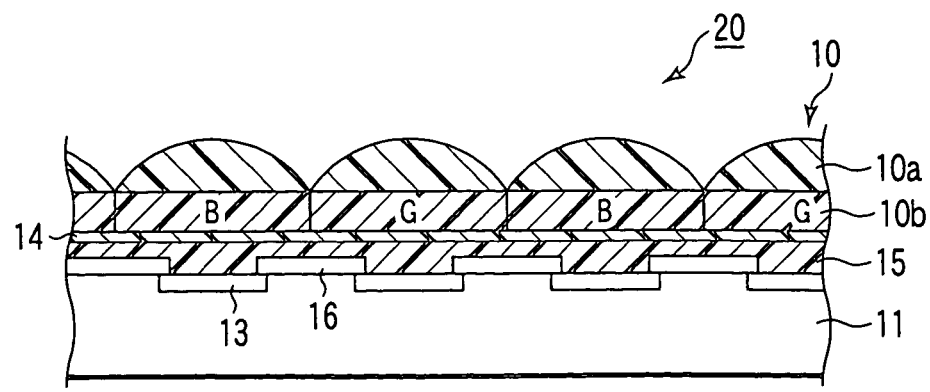
FIG. 5B is a sectional view taken along a line A—A of another solid-state imaging device 20 according to the second embodiment in FIG. 4.

As shown in FIG. 5B, an ultraviolet absorbing layer 14 can be placed between the planarized layer 15 and the colored lower layer 10b.

With recent advances in miniaturization of solid-state imaging devices, pixels (or microlenses) tend to become extremely small regions with a 3 or 2 μm pitch or less. With these minute pixels, a pattern shape fluctuation affects image quality in the form of image quality unevenness or the like.

In order to prevent the reflection of light from an underlayer which causes a pattern shape fluctuation (re-reflected light in a stepper exposure apparatus (ultraviolet light having an exposure wavelength of 365 nm), a layer having an ultraviolet absorbing function is preferably formed in advance as an underlayer of a colored lower layer. The ultraviolet absorbing layer 14 may be formed on the planarized layer 15 or the planarized layer 15 may have an ultraviolet absorbing function. It suffices if a layer having an ultraviolet absorbing function can be formed under the colored lower layer 10b and the ultraviolet absorbing layer 14 may also have an ultraviolet absorbing function.

The ultraviolet absorbing layer 14 is manufactured by inserting a step of coating an ultraviolet light absorbing layer between a step of forming an infrared absorbing layer and a step of forming a lens matrix. Forming an ultraviolet absorbing layer in the manufacturing process in this manner can form a high-precision microlens pattern while preventing halation in the stepper exposure apparatus. In addition, a function of protecting an infrared absorbing layer with relatively low light resistance against ultraviolet light can be added.

For the ultraviolet absorbing layer 14, a transparent resin can be used such as acrylic resin, epoxy resin, polyester resin, urethane resin, melamine resin, urea resin, styrene resin, phenol resin, or a copolymer thereof.

The ultraviolet absorbing layer 14 is directed to an i line (365 nm) used in the manufacturing process for a solid-state imaging device and ultraviolet light contained in external light when a camera in which the solid-state imaging device is mounted is used. In the former case, the ultraviolet absorbing layer 14 ensures the lens matrix pattern shape by preventing halation of an i line (365 nm). In the latter case, the ultraviolet absorbing layer 14 absorbs ultraviolet light to prevent a deterioration in the function of the infrared absorbing layer.

In addition, an ultraviolet absorbing function can be implemented by adding an ultraviolet absorbing compound or ultraviolet absorbing agent to the above transparent resin or planarized layer formation resin or by the pendant method (the agent in the form of a reactive ultraviolet absorbing agent or the like is bonded to resin molecular chains). Ultraviolet absorbing agents that can be used include a benzotriazole-based compound, benzophenone-based compound, salicylic-acid-based compound, and coumarin-based compound. For example, a light stabilizer such as hindered-amine-based compound or a quencher (e.g., a singlet oxygen quencher) may be added to such an ultraviolet absorbing agent. Alternatively, an ultraviolet absorbing agent made of metallic oxide particles such as cerium oxide or titanium oxide may be used.

The microlens 10 includes the transparent resin upper layer 10a and colored lower layer 10b. The transparent resin upper layer 10a and planarized layer 15 have an infrared absorbing function. For this reason, the solid-state imaging device 20 requires no infrared cut filter. Therefore, the under-lens distance is smaller than that in the prior art without any degradation in color reproducibility.

Infrared absorbing agents that can be used for the transparent resin upper layer 10a and planarized layer 15 include an anthraquinone-based compound, phthalocyanine-based compound, cyanine-based compound, polymethylene-based compound, aluminum-based compound, dimonium-based compound, imonium-based compound, and azo-based compound, and the like.

In addition, an infrared absorbing function can be implemented by adding an infrared absorbing compound or infrared absorbing agent to the above transparent resin or by the pendant method (the agent in the form of a reactive dye or reactive infrared absorbing agent is bonded to resin molecular chains).

The absorption wavelength ranges of many infrared absorbing agents are limited, so that it is difficult to cover the entire near-infrared region and infrared region (e.g., 650 nm to 1,100 nm) required in a photo diode of a C-MOS, CCD, or the like with one type of infrared absorbing agent. For this reason, a plurality of infrared absorbing agents, e.g., two to six types of agents, are preferably used in combination, or one constituent element is preferably formed into multiple layers.

In order to add a sufficient infrared absorbing function while ensuring high transmittance in the visible range (400 nm to 700 nm), the infrared absorbing function is preferably distributed to a plurality of constituent elements arrayed on photo diodes such as C-MOSs, CCDs, or the like. For example, identical infrared absorbing agents are preferably contained in different constituent elements to enhance the infrared absorbing function. Alternatively, infrared absorbing agents with different absorption wavelength ranges are preferably contained in different constituent elements to distribute an infrared absorbing function. Furthermore, in consideration of, for example, the heat resistance of an infrared absorbing agent, a specific constituent element may be selected as one in which the agent should be contained.

When the colored lower layer 10b is made to have an infrared absorbing function, the types and contents of infrared absorbing agents with different absorption ranges are preferably adjusted before they are contained. This is because in a primary color (RGB) or complementary color (YMC) filter layer, the spectral characteristics (absorption) in the infrared region vary for the respective colors.

The depth of dry etching, conditions for gases to be used, and conditions for colored resins to be used for the colored lower layer 10b in forming the microlens 10 are the same as those in the above embodiment. In order to increase the open area ratio of the microlens 10 by reducing a non-opening portion 25 or improve the infrared absorbing function, a thin infrared absorbing layer may be stacked on the microlens 10 by coating.

To reduce re-reflection of incident light from the surface or non-opening portion of the microlens 10, a thin, low refractive index resin film is preferably formed on the microlens 10 or the above thin infrared absorbing layer. In addition, a thin film made of a low refractive index material may be stacked on the non-opening portion 25 (FIG. 4) exposed between the microlenses 10 to absorb stray light reflected by the surface of the microlenses so as to reduce noise (re-incidence of reflected light in this case) produced in the solid-state imaging device.

EXAMPLE 1 OF MANUFACTURING METHOD

A method of manufacturing the solid-state imaging device 20 will be described in detail next.

Figure 6A:
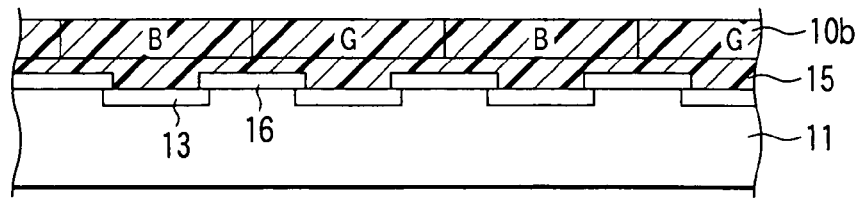
FIGS. 6A to 6C are views for explaining a method of manufacturing the solid-state imaging device 20.
Figure 6B:
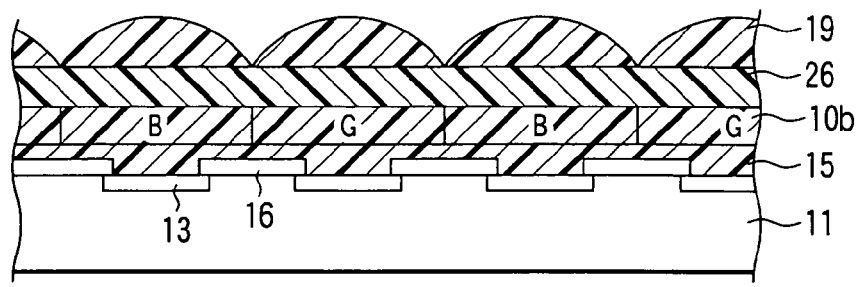
Figure 6C:
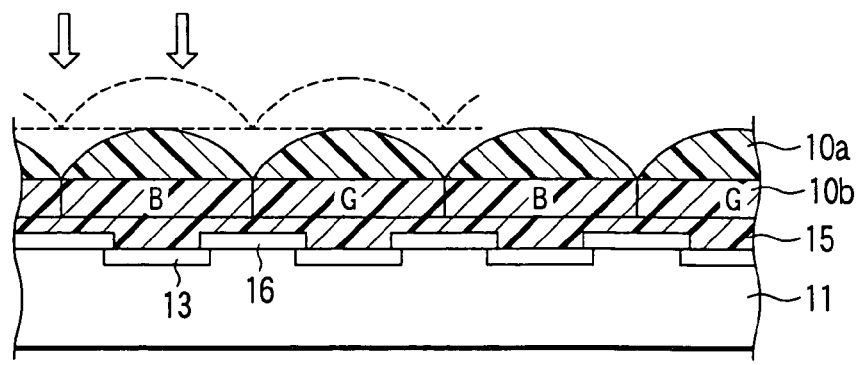

FIGS. 6A to 6C are views for explaining the method of manufacturing the solid-state imaging device 20.

As shown in FIG. 6A, after a planarized layer 15 is formed on a semiconductor substrate 11, on which a photo diodes 13 and light-shielding layers 16 are formed, colored lower layers 10b in three colors are sequentially formed by known photolithography using colored resists in three colors, i.e., R (Red), G (Green), and B (Blue), and a stepper exposure apparatus. Each colored lower layer 10b has a thickness of, for example, 0.9 μm to 0.8 μm.

Note that colored resists available from Toyo Ink Mfg. Co., Ltd. which use organic pigments as coloring materials can be used for the R (Red), G (Green), and B (Blue) colored lower layers 10b. In Example 1, as a color arrangement, a so-called Beyer arrangement is used, in which one pixel is constituted by two G (Green) elements, one R (Red) element, and one B (Blue) element, i.e., a total of four elements. FIG. 6 is a plan view of a solid-state imaging device 20 viewed from the microlens side, and is also a view showing a two-dimensional (planar) arrangement of color filter layers and microlenses in the Beyer arrangement.

As shown in FIG. 6B, a 1-μm thick infrared absorbing layer 26 is formed on the colored lower layers 10b by using a resin coating solution containing three types of infrared absorbing agents. In addition, the resultant structure is coated with a photosensitive phenol resin having heat flow properties by spin coating, and a hemispherical lens matrix 19 is formed by exposure, development, and heat flow. The heat flow temperature at this time is, for example, 200□, and the thickness (lens height) of the lens matrix 19 is 0.7 μm.

In this example, as a resin coating solution having an infrared absorbing function, a resin coating solution is used, which is obtained by dissolving 100 parts by weight of thermosetting acrylic resin and 20 parts by weight of a combination of three types of agents, i.e., infrared absorbing agents YKR-3080, YKR-3030, and YKR-200 available from Yamamoto Kasei K.K., in an organic solvent such as cyclohexanone.

As shown in FIG. 6C, the semiconductor substrate 11 on which the lens matrices 19 are formed is subjected to an etching process (white arrows) using $O_2$ gas by a dry etching apparatus. This process is performed at a substrate temperature of room temperature, a pressure of 1 Pa, an RF power of 500 W, and a bias of 50 W to completely transfer the lens matrices 19 to the underlying infrared absorbing layer, thereby forming the transparent resin upper layer 10a having an infrared absorbing function.

Note that the shape of a microlens can be matched with optimal optical characteristics by using resin materials having different etching rates, e.g., a resin with a low etching rate, such as phenol resin, for the lens matrix 19 (or using a material with a high etching rate as a resin for an underlying infrared absorbing layer).

EXAMPLE 2 OF MANUFACTURING METHOD

Another method of manufacturing the solid-state imaging device 20 will be described in detail next.

Figure 7:
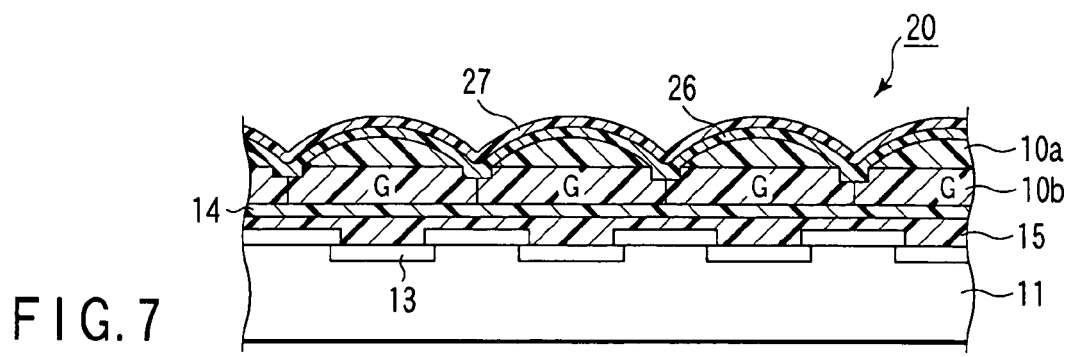
FIG. 7 is a sectional view taken along a line B—B of the solid-state imaging device 20 in FIG. 6 which is manufactured by a method according to the second embodiment.

FIG. 7 is a sectional view taken along a line B—B of the solid-state imaging device 20 in FIG. 6, which is manufactured by the method according to Example 2. As shown in FIG. 7, in the solid-state imaging device 20, a planarized layer 15 having an average thickness of 0.6 μm is formed on a semiconductor substrate 11 on which photo diodes 13 are formed, and a 0.5-μm thick ultraviolet absorbing layer 14 is stacked on the planarized layer 15 by coating. In addition, 0.9-μm thick colored lower layers 10b in three colors are formed by using reactive dyes as coloring materials. Note that FIG. 7 shows only G (Green) pixels in a Beyer arrangement because FIG. 7 is a sectional view taken along a line B—B in FIG. 6.

A thin film 26 as an infrared absorbing layer and a thin film of a low refractive index resin 27, each having a thickness of about 0.1 μm, are formed on the colored lower layers 10b by spin coating. A portion of a thin film as an infrared absorbing layer which is located in the recess portion between microlenses 10 has a relatively large thickness of about 0.5 μm. This is because a recess having a depth of about 0.4 μm is formed in advance between colors of the color filter by dry etching, as will be described later.

Figure 8A:
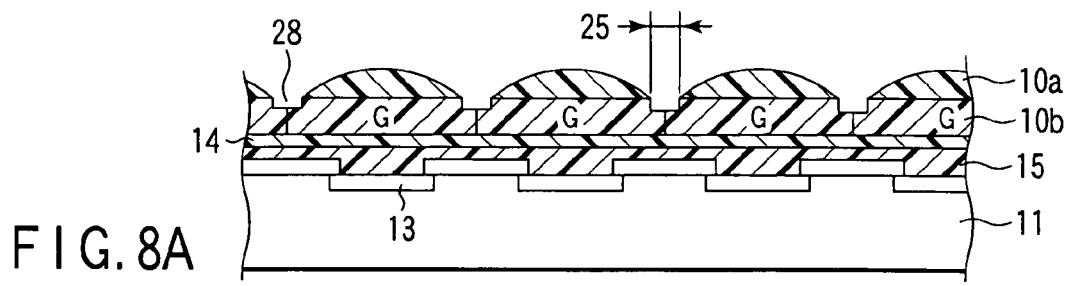
FIGS. 8A to 8C are views for explaining a method of manufacturing the solid-state imaging device 20.
Figure 8B:
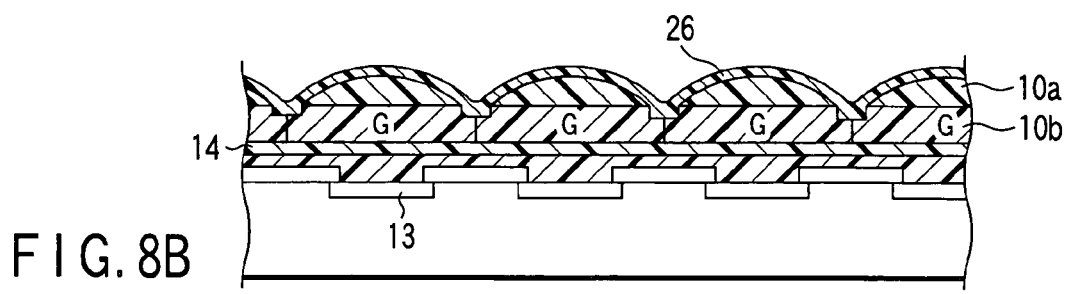
Figure 8C:
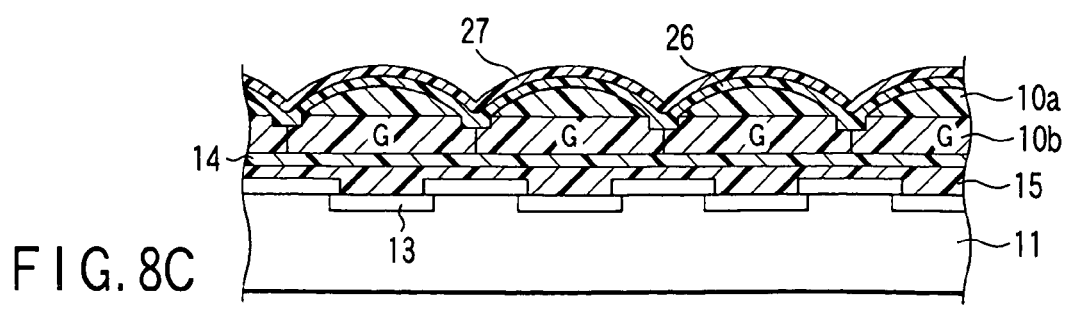

FIGS. 8A to 8C are views for explaining the method of manufacturing the solid-state imaging device 20. First of all, as shown in FIG. 8A, each planarized layer 15 having an infrared absorbing function and the ultraviolet absorbing layer 14 is formed on the semiconductor substrate 11 by coating using a spin coating technique. These layers are hardened by using, for example, a hot plate at 230° C. In addition, the colored lower layers 10b in three colors are sequentially formed by photolithography, as in Example 1, using colored resists (photosensitive acrylic resin base) containing dyes as coloring materials.

After the infrared absorbing layer 26 and lens matrices 19 are formed, the lens matrices are transferred by dry etching to form the microlenses 10, as in Example 1. In this case, the colored lower layers 10b are partly etched. A recess 28 having a depth of 0.4 μm is formed between the pixels of the colored lower layers 10b.

As shown in FIG. 8B, the thin film 26 of the infrared absorbing layer having a thickness of about 0.1 μm (having a larger thickness in a recess between microlenses) is formed. As shown in FIG. 8C, the low refractive index resin 27 (fluorine-based acrylic resin: refractive index of 1.45) having a thickness of about 0.1 μm is formed by coating. Stacking the low refractive index resin 27 can decrease the reflectance by about 2% (i.e., a 2% increase in transmittance) as compared with an arrangement without the low refractive index resin 27 (e.g., the arrangement shown in FIG. 8B).

As described above, the solid-state imaging device 20 and its manufacturing method according to this embodiment can obtain at least any one of the following effects.

First, since the transparent resin upper layer 10a and planarized layer 15 of the solid-state imaging device 20 have the infrared absorbing function, there is no need to use any conventional infrared cut filters. This makes it possible to easily reduce the size of a camera.

Second, since a plurality of types of infrared absorbing agents having different infrared absorption wavelength ranges are distributed to the respective constituent elements to give them absorption abilities, a wide-range infrared absorbing function can be arbitrarily set in the solid-state imaging device 20 without any difficulty. In addition, this function can be provided in an optimal place in consideration of the heat resistance or light resistance of each infrared absorbing agent.

Third, since the lens matrices 19 are transferred to the infrared absorbing layer 26 by dry etching, a solid-state imaging device having a thin-film arrangement with high utilization efficiency of light can be provided. In addition, since part of each colored lower layer 10b is also etched, a further reduction in thickness can be achieved. This makes it possible to provide a solid-state imaging device with higher image quality.

Fourth, providing an ultraviolet absorbing function for the surface of each microlens 10 or an underlayer of each colored lower layer 10b can protect an infrared absorbing agent with relatively poor light resistance.

Fifth, by forming thin, low refractive index resin films on the surfaces and non-opening portions of the microlenses 10, reflected light can be reduced. This can improve the image quality of the solid-state imaging device. In general, reflected light from a microlens or the surface of a thin infrared absorbing layer becomes re-reflected light from the cover glass of a solid-state imaging device to be re-incident on the solid-state imaging device. This light becomes noise to cause a deterioration in image quality. However, the solid-state imaging device 20 can reduce such noise, and hence can obtain high image quality.

Sixth, the solid-state imaging device 20 can be manufactured, which can eliminate the necessity of a conventional infrared cut filter by making the transparent resin upper layer 10a and planarized layer 15 have an infrared absorbing function. This is because the above manufacturing method includes a step of forming the planarized layer 15 having the infrared absorbing function on each photo diode 13 on the semiconductor substrate 11, a step of forming the colored lower layers 10b, a step of forming the infrared absorbing layer 26, a step of forming the lens matrices 19 by photolithography and annealing, and a step of transferring a lens matrix pattern to the infrared absorbing layer 26 by dry etching to form the infrared absorbing layer 26 into the transparent-resin upper layers 10a.

(Third Embodiment)

Figure 9:
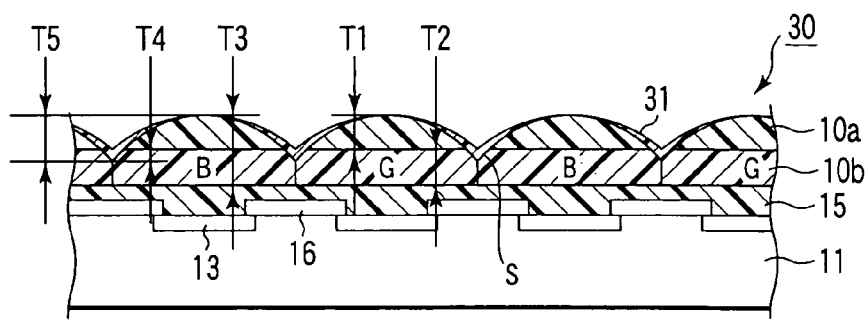
FIG. 9 is a sectional view taken along a line A—A of a solid-state imaging device 30 according to the third embodiment in FIG. 4.

FIG. 9 is a sectional view taken along a line A—A of a solid-state imaging device 30 according to the third embodiment in FIG. 4. The arrangement of the solid-state imaging device 30 will be described first with reference to FIG. 9.

As shown in FIG. 9, the solid-state imaging device 30 includes microlenses 10, a semiconductor substrate 11, photo diodes 13, a planarized layer 15, light-shielding layers 16, and an outer resin layer 31.

As shown in FIG. 9, the thickness T5 of the microlens 10 is the sum of the thickness T1 of a transparent resin upper layer 10a and the thickness T4 of a lower colored layer forming part of the microlens (the depth of a notched portion of a colored lower layer 10b in the form of a lens) (T5=T1+T4).

The preferable thickness T1 of the transparent resin upper layer 10a, the preferable thickness T2 of the colored lower layer 10b, and the area of the interface between the transparent resin upper layer 10a and the colored lower layer 10b are the same as those in the above embodiments.

This embodiment is also the same as the first embodiment in that the surface of a portion of the colored lower layer 10b which corresponds to a bottom portion of the microlens 10 is a curved surface formed by extending the curved surface of the transparent resin upper layer 10a.

The outer resin layer 31 is a thin film formed on the S portion of each colored lower layer 10b which corresponds to a bottom portion of the microlens 10. The outer resin layer 31 is preferably made of a transparent resin material (low refractive index resin) having a lower refractive index than the colored lower layer 10b. In addition, the outer resin layer 31 is preferably formed by coating to a thickness that can easily obtain an antireflection effect by light interference at the colored lower layer and low refractive index resin. This is because the colored lower layer 10b contains a color material (pigment or dye), and hence tends to optically have a high refractive index. Owing to this antireflection effect, the influence of reflected light from a non-opening portion 25 can be reduced to prevent a deterioration in image quality due to re-incident light.

The refractive index of the transparent resin upper layer 10a as part of the microlens 10 is preferably decreased to reduce surface reflection. In order to increase the amount of light transmitted, a thin optical film for the reduction of reflection may be inserted between the transparent resin upper layer and the colored lower layer. Alternatively, an antireflection film may be stacked on the entire surface of the microlens 10. The transparent resin upper layer 10a with a low refractive index is preferable for the present invention directed to minute pixels because a thicker film can be formed as compared with a case wherein the transparent resin upper layer has a high refractive index.

The transparent resin upper layer 10a is formed from a fluorine-based acrylic resin which is a low refractive index resin. This makes it possible to reduce reflected light at the microlens 10.

In general, the focal length $f$ of a lens having a radius $r$ is given by $$f = n1/(n1-n0) \cdot r \qquad (1)$$

where $r$ is the radium of the spherical surface, $n0$ is the refractive index of air, and $n1$ is the refractive index of the lens. For example, a lens with refractive index $n1=1.61$ has a focal length of 2.64 r in an air medium (refractive index $n0=1$).

As described above, it is generally difficult to form a hemispherical microlens with a thickness of 0.4 μm or less. If, however, the transparent resin upper layer 10a is formed by using a transparent resin with a low refractive index of 1.5 or less, and preferably a refractive index in the range of 1.45 to 1.40, a relatively thick, hemispherical microlens 10 can be stably formed. For example, using a transparent fluorine-based acrylic resin with a refractive index of 1.43 makes it possible to increase the thickness of the microlens from 0.4 µm by 1.25 times to 0.5 µm.

The depth of dry etching, conditions for gases to be used, and conditions for colored resins to be used for the colored lower layer 10b and resins and dyes for photosensitive colored resists to be used for the formation of the colored lower layer 10b in forming the microlens 10 are the same as those in the above embodiments.

EXAMPLE OF MANUFACTURING METHOD

A method of manufacturing the solid-state imaging device 30 will be described in detail next.

In the solid-state imaging device 30 according to this example, the peak thickness T1 of a transparent resin upper layer 10a (the height from the bottom surface to the vertex of the central portion) is set to 0.3 µm, and the thickness T5, i.e., the sum of the peak thickness and the depth of a notched portion of a colored lower layer 10b in the form of a lens, is set to about 0.8 µm. In addition, the thickness T2 of the colored lower layer 10b alone is set to 0.9 µm. With such settings, the under-lens distance becomes as low as about 3.1 µm, which is 56% of 5.5 µm in the prior art.

The R (red), G (Green), and B (Blue) colored lower layers 10b are formed by using acrylic-based photosensitive colored resists obtained by preparing coloring materials mainly including dyes represented by color indices, C.I. Acid Red 114, C.I. Acid Green 16, and C.I. Acid Blue 86, together with acrylic-based resins, and a cyclohexane solvent. The amount of coloring material added is about 20% in terms of solid content ratio in each resist.

Figure 10A:
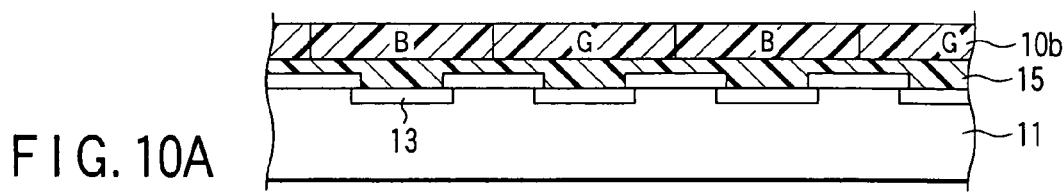
FIGS. 10A to 10C are views for explaining a method of manufacturing the solid-state imaging device 30.
Figure 10B:
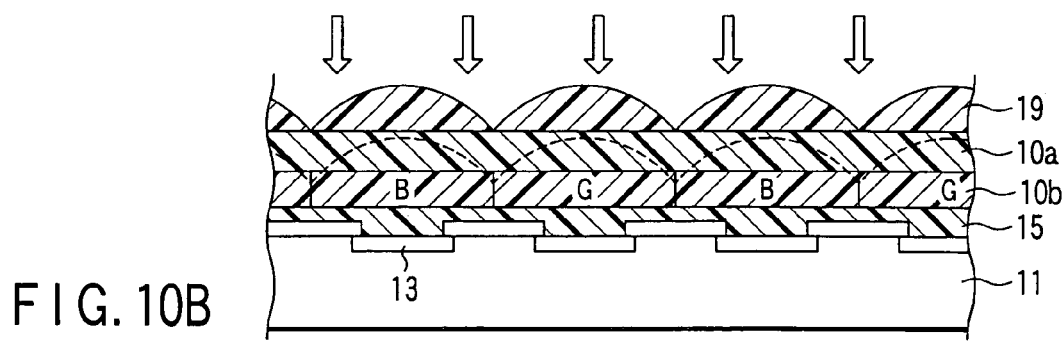
Figure 10C:
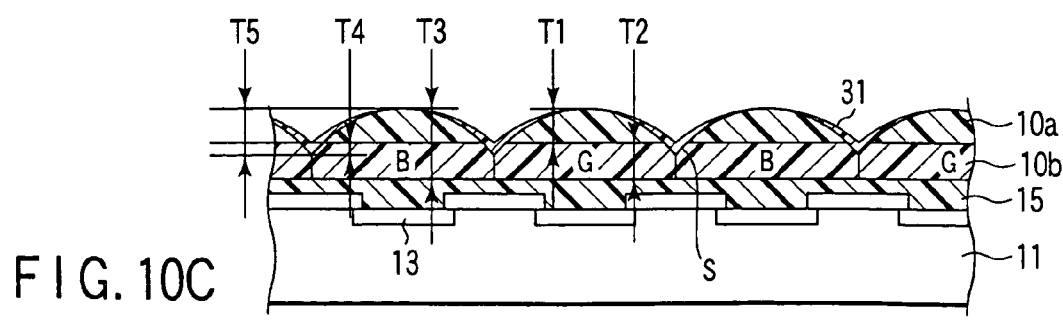

FIGS. 10A to 10C are views for explaining the method of manufacturing the solid-state imaging device 30. First of all, as shown in FIG. 10A, photo diodes 13, light-shielding films 16, and passivations are formed on a semiconductor substrate 11. A planarized layer 15 is formed on the semiconductor substrate 11 by spin coating using a thermosetting acrylic resin coating solution. In addition, colored lower layers (33) are formed using R (red), G (Green), and B (Blue) photosensitive colored resists by performing photolithography three times. The respective photosensitive colored resists in R (Red), G (Green), and B (Blue) are coated by spin coating, and exposure is performed by using a stepper exposure apparatus.

As shown in FIG. 10B, a transparent resin upper layer 10a is formed on the R (red), G (Green), and B (Blue) colored lower layers 10b by spin coating using a thermosetting acrylic resin coating solution (first resin coating solution).

The transparent resin upper layer 10a is coated with a photosensitive acrylic-based resin by spin coating, and a hemispherical lens matrix 19 is formed by exposure, development, and heat flow. Note that the temperature in a heat flow process is set to, for example, 190° C.

The semiconductor substrate 11 on which the lens matrices 19 are formed is etched by a dry etching apparatus using $O_2$ gas. This etching process is executed at, for example, a substrate temperature of room temperature, a pressure of 1 Pa, an RF power of 500 W, and a bias of 50 W.

An outer resin layer 31 which is a thin transparent resin film is formed, as shown in FIG. 10C, by spin-coating a thermosetting fluorine-based acrylic resin having a refractive index of 1.45 (second resin coating solution) (obtained by diluting the first resin coating solution in an organic solvent) to a thickness of about 0.09 µm.

In this example, as resin materials for the colored lower layer 10b and planarized layer 15, acrylic resins which have almost the same refractive index in the refractive index range of 1.51 to 1.55 at a light wavelength of 550 nm are used. The transparent resin upper layer 10a is formed by using a fluorine-based acrylic resin with a refractive index of 1.45 which is available from Nippon Kayaku Co., Ltd. It is relatively difficult to accurately measure the refractive indices of the colored lower layers 10b due to the coloring materials contained in the layers. However, the refractive index of the R (red) layer which is 1.61 at 700 nm (the R (red) layer exhibits large absorption with respect to 550-nm green light, and hence it is difficult to accurately measure a refractive index at 550 nm).

Figure 11:
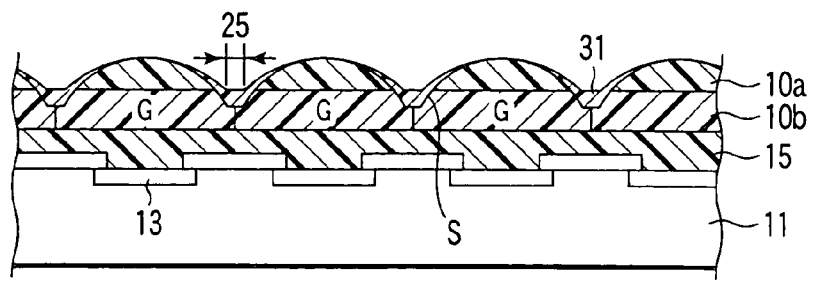
FIG. 11 is a sectional view taken along a line B—B of the solid-state imaging device 30 according to the third embodiment in FIG. 4.

FIG. 11 is a sectional view taken along a line B—B in FIG. 4. FIG. 4 shows non-opening portions 25 of the solid-state imaging device 30. In the stage shown in FIG. 10B, the colored lower layers with a high refractive index are exposed on the non-opening portions 25 and portions S corresponding to bottom portions of microlenses. In the final stage, however, this surface is coated with the outer resin layer 31 having a thickness of about 0.09 µm. The light interference effect by the outer resin layer 31, together with light absorption by the colored lower layer, can greatly reduce re-reflected light from the non-opening portion 25. The bottom portion S of the microlens, which is the surface of the colored lower layer, is slightly roughened by dry etching or the like. This also provides the effect of reducing reflected light.

In this example, a description of a step of exposing pad portions (electrical connection portions) of an imaging device is omitted. If the outer resin layer 31 is used in the form of an alkali soluble photosensitive resin, the step of exposing pad portions can be replaced with the exposure and development steps. In addition, in this example, the thin outer resin layer 31 is stacked. However, the outer resin layer 31 may be omitted. In this arrangement, although the amount of reflected light from the non-opening portion 25 in FIG. 11 slightly increases, since the etching process described in this example as well can also be used as the step of exposing pad portions, the omission of the step will achieve a reduction in cost.

The solid-state imaging device 30 and its manufacturing method according to this embodiment described above can obtain at least any one of the following effects.

First, the under-lens distance is reduced to improve the light condensing performance, and a device can be easily processed even with a small pixel pitch for the following reasons. In this solid-state imaging device, each microlens has at least a two-layer structure constituted by a transparent resin upper layer and colored lower layer, and the interface between the transparent resin upper layer and the colored lower layer is flat. In addition, the surface of a portion of the colored lower layer which corresponds to a bottom portion has a curved surface formed by extending the curved surface of the transparent resin upper layer, and the refractive index of the transparent resin upper layer is lower than that of the colored lower layer. Therefore, the under-lens distance can be made smaller than that in the prior art, and each microlens 10 having a predetermined thickness or more can be formed.

Second, degradation in the color purity of a chromatic lens is suppressed to contribute to high image quality, and the S/N ratio can be increased by reducing reflected light from each non-opening portion for the following reasons. In this solid-state imaging device, the surface of each colored lower layer is covered with a thin transparent resin film having a lower refractive index than the colored lower layer, and the transparent resin upper layer is made of a fluorine-based acrylic resin.

(Fourth Embodiment)

Figure 12A:
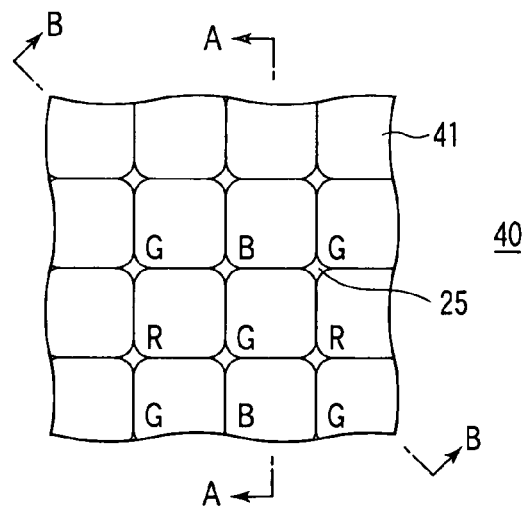
FIG. 12A is a top view of a solid-state imaging device according to the fourth embodiment viewed from the microlens side, and also is a view showing a two-dimensional (planar) arrangement of colored lower layers and microlenses in the Beyer arrangement.
Figure 12B:
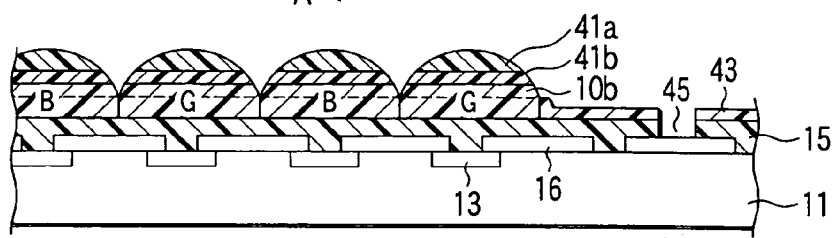
FIG. 12B is a sectional view taken along a line A—A of a solid-state imaging device 40 according to the fourth embodiment in FIG. 4.

FIG. 12A is a top view of a solid-state imaging device 40 according to the fourth embodiment viewed from the microlens side, and is also a view showing a two-dimensional (planar) arrangement of colored lower layers and microlenses in the Beyer arrangement. FIG. 12B is a sectional view taken along a line A—A of the solid-state imaging device 40 in FIG. 12A. The arrangement of the solid-state imaging device 40 will be described first with reference to FIG. 12B.

As shown in FIG. 12B, the solid-state imaging device 40 includes substantially hemispherical microlenses 41, a semiconductor substrate 11, photo diodes 13, a planarized layer 15, light-shielding layers (also serving as electrodes) 16, and an outer resin layer 31.

Each microlens 41 has a lens matrix 41a formed by dry etching or the like, a transparent resin intermediate layer 41b, and a colored lower layer 10b. At least part of the transparent resin intermediate layer 41b and colored lower layer 10b forms part of a substantially hemispherical shape.

The transparent resin intermediate layer 41b is formed as an underlayer of the lens matrix 41a, and is made of the same material as that for the transparent resin upper layer 10a in the first to third embodiments described above. The colored lower layer 10b is formed as an underlayer of the transparent resin intermediate layer 41b. The interface between a transparent resin upper layer 41ab and the colored lower layer 10b has a shape conforming to the surface of the photo diode 13, i.e., a flat shape. The area of this flat surface corresponds to the effective area of the colored lower layer 10b.

The above arrangement of the microlens 41 makes it possible to decrease an under-lens distance D1. This allows the substantial lens thickness to be 0.5 μm or more so as to facilitate microlens processing with a pixel pitch of 3 μm or less.

Figure 13:
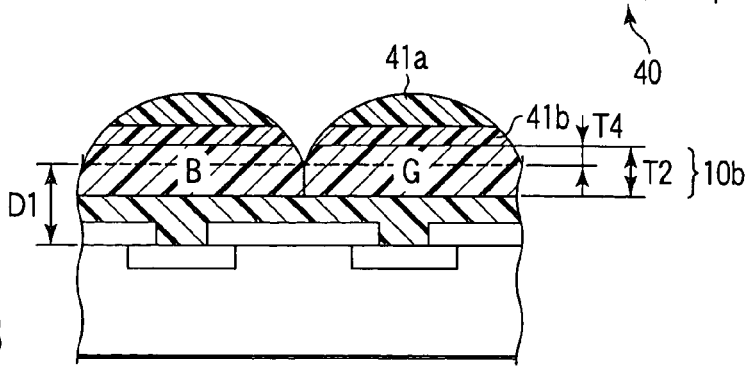
FIG. 13 is an enlarged view of microlenses 41 and is also a view for explaining the thickness of a colored lower layer 10b.

FIG. 13 is an enlarged view of the microlenses 41, and is also a view for explaining the thickness of each colored lower layer 10b. As shown in FIG. 13, the solid-state imaging device 40 according to this embodiment has an arrangement which satisfies the condition $T4 \leq 0.52T2$ where T4 is the thickness of a portion of the colored lower layer 10b which forms a curved portion of the microlens 41, and T2 is the thickness of the colored lower layer 10b. In this arrangement, an interface portion of the colored lower layer 10b is used as a lens to minimize the under-lens distance D1, and at the same time, degradation in the color impurity of the colored pixel layer can be prevented.

Figure 14:
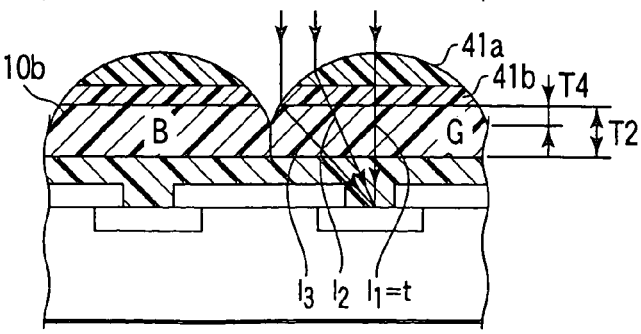
FIG. 14 is a view for explaining the effects of the solid-state imaging device 40 according to the fourth embodiment.

Basically, in order to decrease the under-lens distance, dry etching is performed as deeply as possible. If, however, etching is done to the underlayer surface of the colored pixel layer, the flat surface (effective surface) of the colored pixel layer decreases. As a consequence, incident light with degraded color impurity from the periphery of each microlens increases in amount, leading to a deterioration in image quality. Excessive etching (T4>0.5T) will produce gaps between color filters, reducing the open area ratio. In addition, with T4>0.5T, as shown in FIG. 14, a wavelength $l_3$ of light crossing each colored pixel becomes excessively small, adversely affecting the color impurity (image quality). For this reason, it is necessary for the thickness of part of a colored pixel layer to satisfy the condition $T4 \leq 0.5T2$.

Note that the lower limit of T4 preferably satisfies the condition $0.02T2 \leq T4$ for the following reason. A resin is dry-etched with a resolution of about 0.02. This resolution corresponds to about 0.02T2 in scale on a colored lower layer. It is therefore believed that when the colored lower layer is etched, the depth of the etched portion becomes equal to or more than the resolution of dry etching, i.e., equal to or more than 0.02T2.

In addition, the planarized layer 15 is formed by using a resin with a transmittance of 40% or less at the exposure wavelength (365 nm) and a transmittance of 90% in the visible range. This arrangement is employed because the transmittance of the colored lower layer 10b at the exposure wavelength (365 nm) and the transmittance of the planarized layer 15 as an underlayer of the colored lower layer 10b at the exposure wavelength (365 nm) greatly influence the pixel shape reproducibility of the colored lower layer 10b, as described with reference the layer having the ultraviolet absorbing function which is part of the solid-state imaging device according to the second embodiment. That is, the reflectance at the wavelength of ultraviolet light (356 nm) which is the exposure wavelength used when the colored lower layer 10b is formed can be suppressed low, and the pixel shape reproducibility of the colored lower layer 10b at a pixel size of 3.5 μm or less can be improved. In the solid-state imaging device 40 with a pixel size of 3.5 μm or less, or a pixel size of 2.5 μm or less, or a pixel size of 2 μm or less, in order to ensure high optical characteristics or high image quality, the pixel size of the colored lower layer 10b must be controlled on the submicron order. Adding an ultraviolet absorbing function to an underlayer of a colored lower layer can provide a noticeable pixel shape improving effect in the range of 2.5 μm to 2 μm.

(Solid-State Imaging Device Manufacturing Method)

A method of manufacturing the solid-state imaging device 40 will be described next. FIGS. 15A to 15G are views sequentially showing steps in an example of the method of manufacturing the solid-state imaging device 40.

Figure 15A:
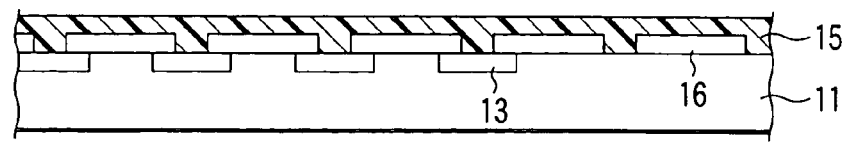
FIGS. 15A to 15G are views sequentially showing steps in an example of a method of manufacturing the solid-state imaging device 40.

As shown in FIG. 15A, first of all, a planarized layer 15 having a predetermined thickness is formed on a semiconductor substrate 11, which has photo diodes 13, light-shielding layers 16, and the like, by coating a resin solution obtained by adding an ultraviolet absorbing agent to a transparent resin such as acrylic resin by spin coating or the like, and heating/hardening the solution. For example, as a transparent resin for the formation of the planarized layer 15, one of the following, other than the above acrylic resin, can be used: epoxy, polyester, urethane, melamine, urea resin such as area, styrene resin, phenol resin, and copolymers thereof.

A method of reducing the transmittance at the exposure wavelength (365 nm) to 40% or less can be implemented by adding an ultraviolet absorbing compound or ultraviolet absorbing agent to the above transparent resin or by the pendant method (the agent in the form of a reactive ultraviolet absorbing agent or the like is bonded to resin molecular chains).

Ultraviolet absorbing agents that can be used include a benzotriazole-based compound, benzophenone-based compound, triazine-based compound, salicylate-based compound, coumarin-based compound, xanthene-based compound, methoxy-cinnamate-based compound, and the like. Alternatively, an ultraviolet absorbing agent made of particles of a metal oxide such as cerium oxide or titanium oxide may be used.

Table 1 below shows the results of colored lower layer shape evaluation with the reflectances of the colored lower layers 10b in the respective colors at the exposure wavelength (365 nm) and a pixel size of 3.5 μm or less upon formation of the planarized layers 15 respectively having transmittances of 10%, 20%, 30%, 40%, and 50% at the exposure wavelength (365 nm).

TABLE 1

Colored lower layer shape evaluation on reflectance (%) with respect to each transmittance of planarized layer at 365 nm

| | 50% | Shape | 40% | Shape | 30% | Shape | 20% | Shape | 10% | Shape |
|---|---|---|---|---|---|---|---|---|---|---|
| C | 2.2% | Δ | 1.4% | ○ | 0.8% | ○ | 0.3% | ○ | 0.1% | ○ |
| M | 11.3 | X | 7.2 | X | 4.1 | X | 1.8 | ○ | 0.5 | ○ |
| Y | 5.0 | X | 3.2 | X | 1.8 | ○ | 0.8 | ○ | 0.2 | ○ |
| R | 2.0% | Δ | 1.2% | ○ | 0.7% | ○ | 0.3% | ○ | 0.1% | ○ |
| G | 0.8 | ○ | 0.5 | ○ | 0.3 | ○ | 0.1 | ○ | 0.0 | ○ |
| B | 0.3 | ○ | 0.2 | ○ | 0.1 | ○ | 0.0 | ○ | 0.0 | ○ |

Note
C: Cyan
M: Magenta
Y: Yellow
R: Red
G: Green
B: Blue
Note
See Table 2 for transmittance of each colored lower layer alone (containing no planarized layer ultraviolet absorption) at 365 nm. Numeral (%) on right side of each colored lower layer is product of squares of transmittance of planarized layer at 365 nm and transmittance of planarized layer at 365 nm, and indicates reflectance at 365 nm.
Note
Colored lower layer shape is evaluated with fine pixel size of 3.5 μm or less.

As shown in Table 1, with regard to complementary color pixels (C, M, Y), when the transmittance of the planarized layer 15 is 20% or less at the exposure wavelength (365 nm), colored lower layer shapes in all three colors are reproduced with high precision. With regard to primary color pixels (R, G, B), when the transmittance is 40% or less, colored lower layer shapes are reproduced with high precision.

Table 2 below shows the transmittances of colored lower layers alone (thickness: 1 μm) at the exposure wavelength (365 nm).

TABLE 2

| | Transmittance (%) of colored lower layer at 365 nm |
|---|---|
| | Transmittance (%) |
| C | 9% |
| M | 45% |
| Y | 20% |
| R | 8% |
| G | 3% |
| B | 1% |

It is obvious from the results in Tables 1 and 2 that the transmittances of these colored lower layers 10b at the exposure wavelength (365 nm) and the transmittances of the planarized layers 15 as underlayers of the colored lower layers 10b at the exposure wavelength (365 nm) greatly influence the pixel shape reproducibility of the colored lower layers 10b. This tendency becomes apparent when the pixel size is 3.5 μm or less, and especially apparent when the pixel size is 3.0 μm or less.

Figure 15B:
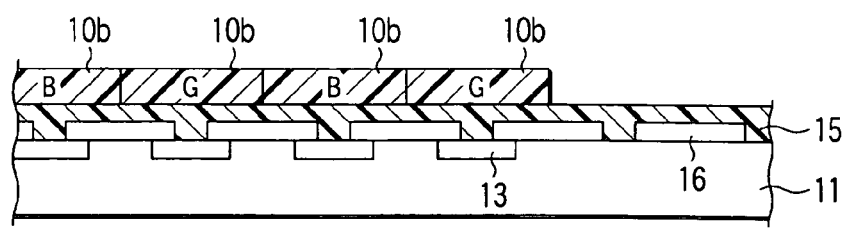

As shown in FIG. 15B, the planarized layer 15 is spin-coated with colored resists in which dyes are contained in advance, thereby forming colored photosensitive layers. A series of patterning processes including pattern exposure, development, and the like are performed for the layers to form the colored lower layers 10b in the respective colors on the planarized layer 15.

It suffices if each colored lower layer 10b has a thickness sufficient for intended color separation, and the thickness is not specifically limited. In general, it suffices if this thickness falls within the range of 0.4 μm to 1.5 μm. A colored resist and a resin material for the transparent resin intermediate layer 41b formed on the colored lower layer 10b are preferably acrylic-based photosensitive resins in consideration of adhesive force, refractive index, and the like.

A dye may be used in a dissolved form into the prime solvent of a colored resist, in a dispersed form, or a form in which a dye is contained in a resin skeleton, i.e., a so-called pendant form. A general dyeing method using a dye bath is not preferable in terms of cost because of an increase in the number of steps. A color filter using a dye as a coloring material can perform high filtration (foreign substance removal) of 0.2 μm to 0.1 μm in the stage of a colored resist, and hence an imaging device having high image quality and greatly increased S/N ratio can be obtained as compared with the case wherein a colored resist dispersed with an organic pigment whose filtration is limited to 1 μm to 0.5 μm is used.

Dyes that can be used include azo-based dyes, xanthenium-based dyes, phthalocyanine-based dyes, anthraquinone-based dyes, coumarin-based dyes, styryl-based dyes, and the like. Primary color dyes, i.e., red, green, and blue dyes, complementary color dyes, i.e., cyan , magenta, and yellow dyes, and dyes obtained by adding a green dye to them can be used.

Although colored resists in which dyes are contained in advance are used as materials for the above colored lower layers 10b, colored resins obtained by using organic pigments as coloring materials may be used. If organic pigments are used, etching rates in dry etching vary depending on the types of pigments used, and hence lens shapes tend to vary for the respective colors. The surfaces become rough. In an imaging device with a fine pixel pitch, the particle size (particle) of a pigment itself is likely to adversely affect the S/N ratio, and it is difficult to perform filtration (foreign substance removal) of the coloring resist material. For these reasons, the colored resins containing dyes as coloring materials are preferably used.

Figure 15C:
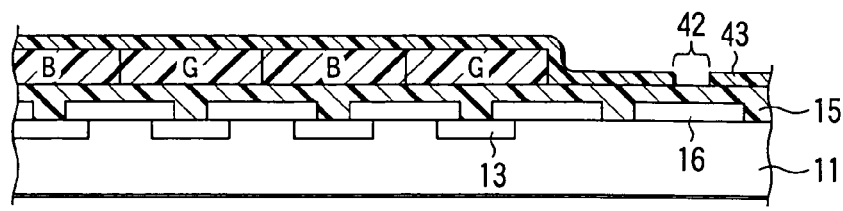

As shown in FIG. 15C, a photosensitive resin layer is formed by spin-coating a phenol-based photosensitive resin solution having heat reflow properties and drying/hardening it. A series of patterning processes including pattern exposure, development, and the like are performed to form a transparent resin intermediate layer 41b having a predetermined thickness and a patterned resin layer 43 having an opening portion 42 above the light-shielding layer 16 are formed on the colored lower layers 10b.

In this case, the thickness of the transparent resin intermediate layer 41b (the peak thickness of the layer in the form of a lens) is not specifically limited. However, the lower thickness limit that can absorb unevenness of a color filter as an underlayer is preferably 0.2 μm or more. The upper limit thickness of the transparent resin intermediate layer 41b is preferably 1 μm because this solid-state imaging device is directed to a fine pixel pitch.

Figure 15D:
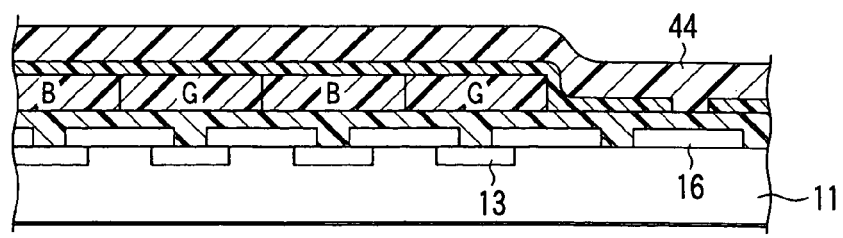

As shown in FIG. 15D, a photosensitive resin layer 44 having a predetermined thickness is formed by spin-coating an acrylic-based photosensitive resin solution having heat reflow properties and drying/hardening it.

Figure 15E:
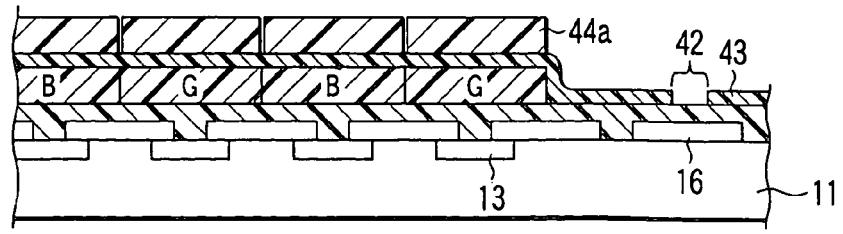

As shown in FIG. 15E, a series of patterning processes including pattern exposure, development, and the like are performed for the photosensitive resin layer 44 to form lens patterns 44a on the colored lower layers 10b.

Figure 15F:
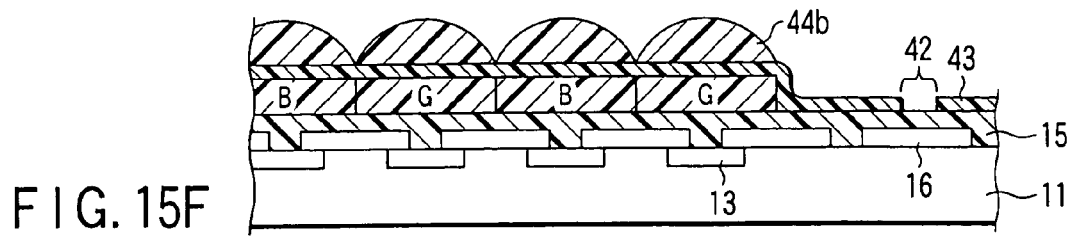

As shown in FIG. 15F, heating reflow is performed for the lens patterns 44a at a predetermined temperature to form lens matrices 44b each having a predetermined curvature. In this case, the radius of curvature of each lens matrix 44b is about 0.7 μm.

Figure 15G:
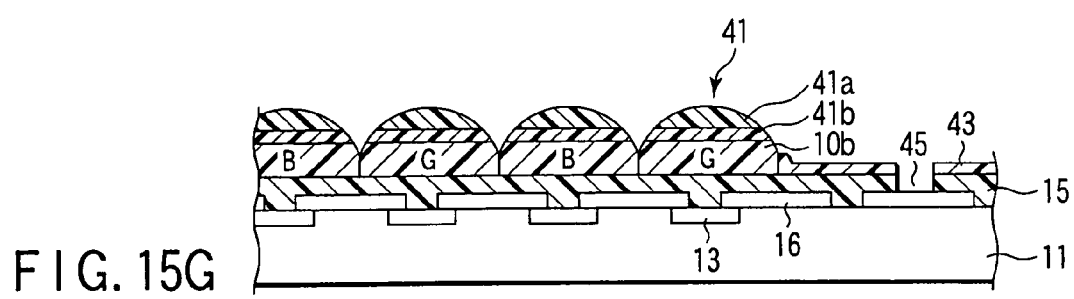

As shown in FIG. 15G, the semiconductor substrate 11 on which the lens matrices 44b are formed is processed by a dry etching apparatus to etch the lens matrices 44b, transparent resin intermediate layers 41b, colored lower layers 10b, and planarized layer 15 to form the microlenses 41 and electric connection pads 45.

Through the respective steps described above, the solid-state imaging device 40 can be obtained, in which the microlenses 41 constituted by the lens matrices 41a, transparent resin intermediate layers 41b, and colored lower layers 10b and the electric connection pads 45 are formed on the semiconductor substrate 11 on which the photo diodes 13 and light-shielding layers 16 are formed.

Note that the etching end point of dry etching is set such that the thickness T4 of part of the colored lower layer 10b becomes ½ or less of the thickness T of the colored lower layer 10b. In dry-etching the lens matrices 41a, etching tends to relatively speed up in the recess portions between the lens matrices 41a, resulting in a deterioration in the finished shape of each microlens. In order to reduce this deterioration, the entire lens matrix is preferably covered with a thin transparent resin layer having a thickness of about 0.05 μm to 0.3 μm before dry etching. Inserting this step can execute lens matrix transfer more smoothly.

In addition, an antireflection film may be formed on the entire surface of each microlens 41. The depth of dry etching, conditions, gases that can be used for dry etching, and the like are the same as those in the first embodiment.

EXAMPLE OF MANUFACTURING METHOD

An example of a method of manufacturing the solid-state imaging device 40 will be described in detail next with reference to FIGS. 15A to 15G.

First of all, as shown in FIG. 15A, a 0.6-μm thick planarized layer 15 is formed on a semiconductor substrate 11, on which photo diodes 13, light-shielding films 16, and passivations, and the like are formed, by coating a resin solution obtained by adding an ultraviolet absorbing agent to a thermosetting acrylic resin or the like, and heating/hardening it. In this case, the transmittance of the 0.6-μm thick planarized layer 15 at the exposure wavelength (365 nm) is 40%.

Coloring materials mainly including dyes represented by color indices, C.I. Acid Red 114, C.I. Acid Green 16, and C.I. Acid Blue 86, are mixed in acrylic-based resins to be formed into photoresists, together with a cyclohexane solvent, to form R, G, and B acrylic-based colored resists. The amount of coloring material added is about 20 wt % in terms of solid content ratio (the sum of polymer, monomer, coloring material, and the like) in each resist.

As shown in FIG. 15B, a patterning process including the formation of a colored photosensitive layer, pattern exposure, development, and the like is performed three times by using R, G, and B acrylic-based colored resists to form 1.2-μm thick R, G, and B colored lower layers 10b. In this case, the respective colored photosensitive layers are formed by spin coating, and pattern exposure is performed by using a stepper exposure apparatus using the exposure wavelength (365 nm).

As shown in FIG. 15C, a photosensitive resin layer is formed by spin-coating a photosensitive, thermosetting phenol-based resin solution having sensitivity with respect to ultraviolet light of 365 nm, and drying/hardening it. Thereafter, a series of patterning processes including pattern exposure, development, and the like are performed to form a 0.4-μm thick transparent resin intermediate layer 41b on the colored lower layers 10b and a patterned resin layer 43 having opening portions 42 on the light-shielding layers 16.

As shown in FIG. 15D, a photosensitive resin layer 44 having a predetermined thickness is formed by spin-coating an acrylic-based photosensitive resin solution having heat reflow properties and drying/hardening it. As shown in FIG. 15E, a series of patterning processes including pattern exposure, development, and the like are performed for the photosensitive resin layer 44 to form lens patterns 44a on the colored lower layers 10b.

As shown in FIG. 15F, a heating reflow process is performed for the lens patterns 44a at a temperature of 190° C. to form lens matrices 44b each having a radius of curvature of about 0.7 μm.

An etching process is performed for the semiconductor substrate 11, on which the lens matrices 44b are formed, by using a dry etching apparatus using $O_2$ gas. This etching process is executed at, for example, a substrate temperature of room temperature, a pressure of 5 Pa, an RF power of 500 W, and a bias of 100 W.

Through the respective steps described above, as shown in FIG. 15G, the solid-state imaging device 40 can be obtained, in which the microlenses 41 constituted by lens matrices 41a, the transparent resin intermediate layers 41b, and the colored lower layers 10b and the light-shielding layers 16 are formed on the semiconductor substrate on which the photo diodes 13 and light-shielding layers 16 are formed.

According to the experiment conducted by the present inventors, the thickness T2 of the colored lower layer 10b was 0.7 μm, whereas the thickness T4 of a portion of the colored lower layer 10b (a portion which forms the curved surface of the microlens 41) was 0.3 μm. The under-lens distance in the solid-state imaging device 40 was about 2.1 μm. That is, an under-lens distance ½ or less of the under-lens distance in the conventional solid-state imaging device, which is 5.5 μm, could be realized.

According to the solid-state imaging device 40 and its manufacturing method according to this embodiment described above, at least any one of the following effects can be obtained.

First, the under-lens distance can be greatly reduced, and hence the incident light condensing performance greatly improves. In addition, since oblique incidence of noise light can be greatly reduced, the image quality of the solid-state imaging device can be improved.

Second, the reduction in lens thickness (or a reduction in lens matrix thickness during the manufacturing process) accompanying a reduction in pixel size can be reduced. This makes it possible to provide a solid-state imaging device with a microlens thickness of 0.5 μm or more which causes no problems in manufacture.

Third, a portion of the colored lower layer 10b is etched to form a lens shape, and hence when a chromatic microlens is used, the difference in color between incident light at the central portion and that at the peripheral portion is eliminated, thereby providing a solid-state imaging device with high image quality. At the same time, since etching is stopped midway in the direction of thickness of the colored lower layer 10b, even if slight variations in etching behavior occur in the direction of thickness, the influences on colors and light condensing performance can be reduced.

Fourth, since the recess portions between the microlenses 41 are colored, reflected light components from the recess portions can be reduced. This can lead to a further improvement in image quality.

Fifth, according to the solid-state imaging device manufacturing method, the conventional complicated step in exposing electrical connection pads can be omitted, and a solid-state imaging device having electrical connection pads obtained by only a simple step of dry etching can be manufactured.

(Fifth Embodiment)

Figure 16:
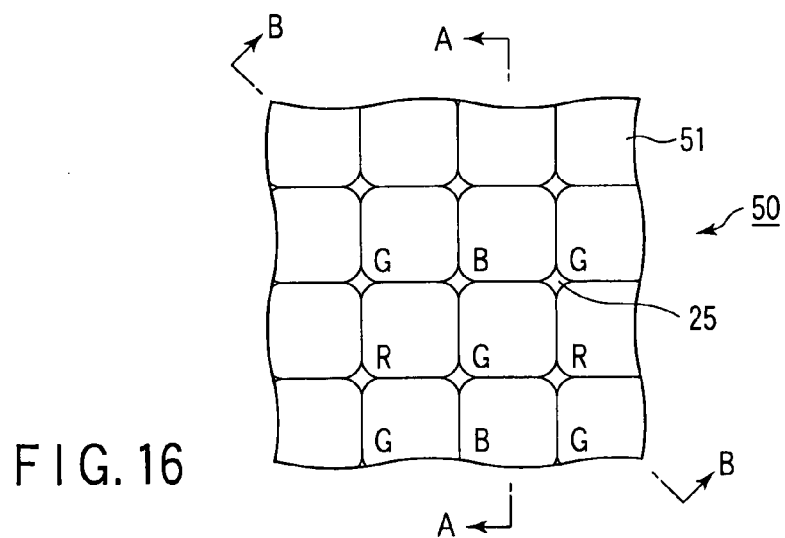
FIG. 16 is a top view of a solid-state imaging device 50 according to the fifth embodiment viewed from the microlens side, and also is a view showing a two-dimensional (planar) arrangement of color filter layers and microlenses in the Beyer arrangement.
Figure 17:
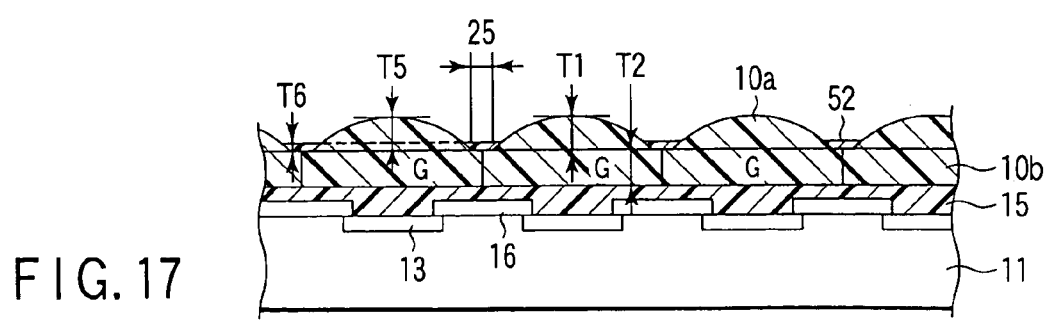
FIG. 17 is a sectional view taken along a line B—B in FIG. 16.
Figure 18:
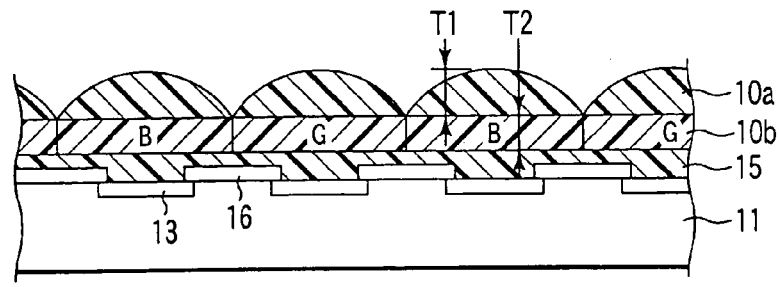
FIG. 18 is a sectional view taken along a line A—A in FIG. 16.

FIG. 16 is a top view of a solid-state imaging device 50 according to the fifth embodiment viewed from the microlens side, and is also a view showing a two-dimensional (planar) arrangement of colored lower layers and microlenses in the Beyer arrangement. FIG. 17 is a sectional view taken along a line B—B in FIG. 16. FIG. 18 is a sectional view taken along a line A—A in FIG. 16. The arrangement of the solid-state imaging device 50 will be described first with reference to FIGS. 16 to 18.

As shown in each drawing, the solid-state imaging device 50 includes substantially hemispherical microlenses 51, a semiconductor substrate 11, photo diodes 13, a planarized layer 15, light-shielding layers 16, and non-opening portion layers 52. Each microlens 51 includes a transparent resin upper layer 10a made of a fluorine-based acrylic resin and a colored lower layer 10b.

The non-opening portion layer 52 is a thin film made of a transparent resin material (low refractive index resin) having a low refractive index, such as a fluorine-based acrylic resin, and formed in a non-opening portion 25 between the microlenses 51 on the upper surface of the colored lower layer 10b. The solid-state imaging device 50 is designed to reduce reflected light from each microlens by forming the microlens 51 and non-opening portion layer 52 using a fluorine-based acrylic resin which is a low refractive index resin. In addition, since the colored lower layer 10b contains a coloring material (pigment or dye), its refractive index tends to be optically high. For this reason, a thin transparent resin film for forming the non-opening portion layer 52 is preferably formed by coating to a thickness that allows easy acquisition of an antireflection effect based on light interference between the colored lower layer 10b and the low refractive index resin. This makes it possible to reduce the influence of reflected light from the non-opening portion 25 and prevent a deterioration in image quality due to re-incident light.

In addition, the solid-state imaging device 50 is aimed at improving heat resistance by forming each microlens 51 and non-opening portion layer 52 using a fluorine-based acrylic resin which is a heat-resistant resin. The use of a fluorine-based acrylic resin prevents discoloration of the microlenses even after annealing at about 250° C. for about 1 hr.

Preferable conditions associated with the thickness T1 of the transparent resin upper layer 10a and the thickness T2 of the colored lower layer 10b are the same as those for the transparent resin upper layer 10a and colored lower layer 10b described in the first embodiment.

In general, the focal length $f$ of a lens having a radius $r$ is represented by equation (1) described above. For example, a lens with refractive index n1=1.61 has a focal length of 2.64 r in an air medium (refractive index n0=1). As described above, it is difficult to form a hemispherical microlens with a thickness of 0.4 μm or less. If, however, a microlens is formed by using a transparent resin with a low refractive index of 1.5 or less, and preferably a refractive index in the range of 1.45 to 1.40, a hemispherical microlens having a thickness of 0.5 μm or more can be stably formed. For example, using a transparent fluorine-based acrylic resin with a refractive index of 1.43 makes it possible to increase the thickness of the microlens from 0.4 μm by 1.25 times to 0.5 μm.

A fluorine-based acrylic resin is a resin having a low refractive index and a high transmittance (reflectance is lower about 2%). This transmittance is higher than that of a high refractive index resin containing the above phenol resin skeleton and having a refractive index of 1.6 to 1.7. That a fluorine-based acrylic resin has a high transmittance is effective in improving the sensitivity and image quality of a solid-state imaging device such as a CCD or C-MOS.

EXAMPLE OF MANUFACTURING METHOD

Figure 19A:
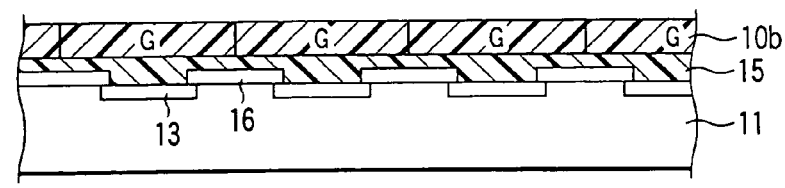
FIGS. 19A to 19C are views for explaining a method of manufacturing the solid-state imaging device 50.
Figure 19B:
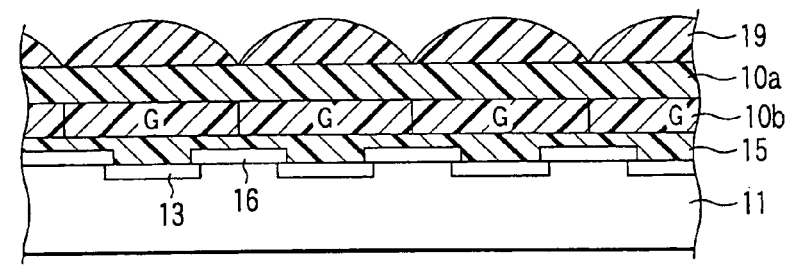
Figure 19C:
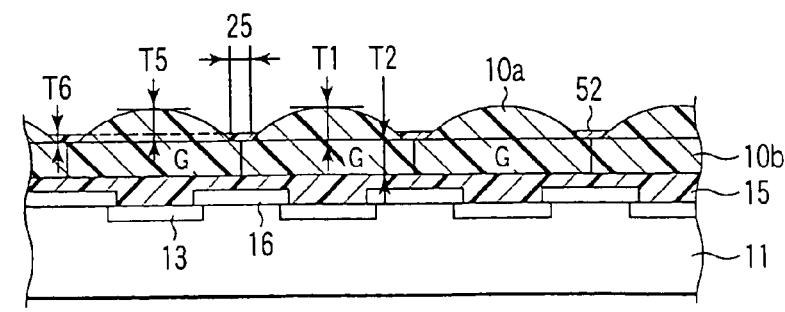

An example of a method of manufacturing the solid-state imaging device 50 will be described in detail next with reference to FIGS. 18 and 19A to 19C. FIGS. 19A to 19C are sectional views taken along a line B—B in FIG. 16 which explain a manufacturing process for the solid-state imaging device 5. As shown in FIG. 18, in the solid-state imaging device 50 according to this example, microlenses 51 constituted by photo diodes 13, colored lower layers 10b, and transparent resin upper layers 10a made of a fluorine-based acrylic resin are formed on a semiconductor substrate 11.

In this example, as resin materials for the colored lower layer 10b and a planarized layer 15, acrylic resins which have almost the same refractive index in the refractive index range of 1.51 to 1.55 at a light wavelength of 550 nm. The transparent resin upper layer 10a is formed by using a fluorine-based acrylic resin with a refractive index of 1.45 which is available from Nippon Kayaku Co., Ltd. It is relatively difficult to accurately measure the refractive indices of the colored lower layers 10b due to the coloring materials contained in the layers. However, the refractive index of the R (red) layer is 1.61 at 700 nm (the R (red) layer exhibits large absorption with respect to 500-nm green light, and hence it is difficult to accurately measure a refractive index at 550 nm).

In addition, the colored lower layer 10b has a refractive index different from that of the matrix resin (shifts to the higher refractive index side) due to the influence of a coloring material dispersed in the resin. As shown in FIG. 16, as a color arrangement in this example, a so-called Beyer arrangement is used, in which one pixel is constituted by two G (Green) elements and one each of R and B (Blue) elements, i.e., a total of four elements. Note that photosensitive colored resists available from Toyo Ink Mfg. Co., Ltd. which use organic pigments as coloring materials can be used for the R (Red), G (Green), and B (Blue) colored lower layers 10b.

FIGS. 19A to 19C are views for explaining the method of manufacturing the solid-state imaging device 50. As shown in FIG. 19A, the planarized layer 15 is formed on the semiconductor substrate 11, on which the photo diodes 13, light-shielding layers 16, and passivations are formed, by spin-coating a thermosetting acrylic resin coating solution. In addition, the colored lower layers 10b are formed by performing photolithography three times using R (Red), G (Green), and B (Blue) photosensitive colored resists. The R (Red), G (Green), and B (Blue) photosensitive colored resists are coated by spin coating, and exposure is done by a stepper exposure apparatus.

As shown in FIG. 19B, the transparent resin upper layer 10a is formed on the R (Red), G (Green), and B (Blue) colored lower layers 10b by spin coating using a thermosetting fluorine-based acrylic resin coating solution (available from Nippon Kayaku Co., Ltd.).

A photosensitive acrylic-based resin having heat flow properties is coated on the transparent resin upper layer 10a by spin coating, and is subjected to exposure, development, and heat flow to form hemispherical lens matrices 19. The heat flow temperature at this time is, for example, 200° C.

An etching process is then performed for the semiconductor substrate 11, on which the lens matrices 19 are formed, by using a dry etching apparatus using $O_2$ gas. This etching process is executed at a substrate temperature of room temperature, a pressure of 1.2 Pa, an RF power of 500 W, and a bias of 200 W.

Finally, the solid-state imaging device 50 shown in FIG. 19C can be obtained by executing an etching process so as to leave a 0.1-μm thick transparent resin (fluorine-based acrylic resin) on each non-opening portion 25 between the microlenses 51.

FIGS. 16 and 17 show the non-opening portions 25 of the solid-state imaging device 50. On the non-opening portion 25, a color filter having a relatively high refractive index is formed as an underlayer, and a fluorine-based acrylic resin which is a low refractive index resin is deposited on this surface to a thickness of about 0.1 μm. The light interference effect by this thin low refractive index resin film and light absorption by the color filter can greatly reduce re-reflected light from the non-opening portion 25.

According to an experiment conducted by the present inventors, the peak thickness T1 of the transparent resin upper layer 10a (the height from the interface with the colored lower layer 10b to the central portion of the lens) of the solid-state imaging device 50 obtained by this example was 0.9 μm, and the thickness T6 of a non-opening portion layer 52 was 0.1 μm. The thickness T5 of the microlens was 0.8 μm, which was obtained by subtracting the thickness T6 of the non-opening portion layer 52 from the thickness T1 of the transparent resin upper layer 10a. The thickness T7 of the colored lower layer 10b alone was 0.8 μm. In addition, the under-lens distance was about 3.3 μm, which was much smaller than 5.5 μm in the prior art, i.e., 60% thereof. In this example, the microlens pitch was set to 3.5 μm, and the inter-lens gap was set to 0.3 μm.

The states of reflected light in the solid-state imaging device 50 according to this example and in conventional solid-state imaging device using a lens material with a high refractive index (refractive index of 1.6) for comparison were measured/compared by using an integrating sphere and variable angle goniometer (both available from Murakami Shikisai K.K.). In this case, the integrating sphere is used to check the total amount of reflected light on the entire device surface. The variable angle goniometer is used to check the state of reflected light at variable angles (locally) by changing the angle of the light-receiving portion with respect to incident light (parallel light).

The solid-state imaging device 50 according to this example decreased in reflectance by 2 to 3% as compared with the prior art throughout the entire visible range when measured with the integrating sphere. In measurement using the variable angle goniometer, light was incident at −5° in almost the regular reflection direction, and the angle of the light-receiving element was changed from +5° to +20°. It was found that the intensity value of reflected light in the solid-state imaging device 50 was as low as half or less of that in the prior art.

In this example, a description of a step of exposing the pad portions (electrical connection portions) of the solid-state imaging device 50 is omitted. If a low refractive index resin is used in the form of an alkali soluble photosensitive resin, the step of exposing pad portions can be replaced with the exposure and development steps.

The solid-state imaging device 50 and its manufacturing method according to this embodiment described above can obtain at least any one of the following effects.

First, the S/N ratio and image quality can be improved by minimizing reflected light from the non-opening portions between the microlenses and the surfaces of the microlenses. This is because in this solid-state imaging device, a transparent resin upper layer made of a fluorine-based acrylic resin is formed on the surface of each colored lower layer, and a non-opening portion layer made of a fluorine-based acrylic resin is formed on each non-opening portion between microlenses so as to prevent reflection from the microlenses.

Second, the substantial lens thickness can be increased from 0.5 μm to 0.3 μm as described above to 0.5 μm or more while the under-lens distance is reduced. This makes it possible to easily process microlenses on an imaging device with a small pixel pitch of 3 μm or less.

Third, since transparent resin upper layers and non-opening portion layers are made of a fluorine-based acrylic resin, heat resistance adaptable to severer processing conditions can be realized as compared with the prior art.

According to the solid-state imaging device and its manufacturing method described above, light condensing performance and S/N ratio can be improved by decreasing the under-lens distance. The substantial thickness of each microlens can be set to 0.5 μm or more. In addition, the open area ratio can be increased by suppressing degradation in the color purity of a chromatic lens.

What is claimed is:

1. A solid-state imaging device comprising:
   a plurality of two-dimensionally arranged photo diodes;
   a plurality of microlenses which cover the respective photo diodes and which include substantially hemispherical shapes, a transparent resin upper layer which forms a portion of the substantially hemispherical shape and a colored lower layer provided between the transparent resin upper layer and the photo diode, the interface between the transparent resin upper layer and the colored lower layer being flat; and
   at least a portion of the colored lower layer forming a portion of the substantially hemispherical shape.

2. A solid-state imaging device according to claim 1, wherein at least the portion of the colored lower layer from the interface to halfway through the colored lower layer in the thickness direction forms a portion of the substantially hemispherical shape.

3. A solid-state imaging device according to claim 1, wherein a remaining portion of the colored lower layer from the interface to halfway through the colored lower layer in the thickness direction maintains a shape when the colored lower layer is formed.

4. A solid-state imaging device according to claim 1, wherein the colored lower layer comprises a colored resin layer containing a dye as a coloring material.

5. A solid-state imaging device according to claim 1, wherein a thickness difference between said plurality of colored lower layers is not more than 0.3 µm.

6. A solid-state imaging device according to claim 1, wherein a refractive index of the transparent resin upper layer is not more than that of the colored lower layer.

7. A solid-state imaging device according to claim 1, further comprising a planarized layer provided between the microlens and the photo diode, and in which at least one of the microlens and the planarized layer has an infrared absorbing function.

8. A solid-state imaging device according to claim 7, further comprising an ultraviolet absorbing layer provided between the planarized layer and the colored lower layer.

9. A solid-state imaging device according to claim 8, wherein the planarized layer has an ultraviolet absorbing function.

10. A solid-state imaging device according to claim 1, wherein the microlens further comprises a lens matrix which is provided on the transparent resin upper layer and forms at least a portion of the substantially hemispherical shape.

11. A solid-state imaging device according to claim 1, wherein a value obtained by subtracting a thickness T1 of the portion of the colored lower layer forming a portion of the substantially hemispherical shape from a thickness T, where T is a thickness of the colored lower layer, is not less than 0.4 µm.

12. A solid-state imaging device according to claim 10, wherein a thickness T1 of a portion of the colored lower layer which forms at least a portion of the substantially hemispherical shape satisfies a condition $0.02T \leq T1 \leq 0.5T$, where T is a thickness of the colored lower layer.

13. A solid-state imaging device according to claim 1, wherein a material for the planarized layer comprises a resin which has a transmittance of not more than 40% at an exposure wavelength and also a transmittance of not less than 90% in a visible range.

14. A solid-state imaging device according to claim 1, wherein a refractive index of the transparent resin upper layer is lower than that of the colored lower layer.

15. A solid-state imaging device according to claim 1, further comprising a refractive outer resin layer which has a lower refractive index than the colored lower layer and covers a portion of the colored lower layer which forms at least a portion of the substantially hemispherical shape.

16. A solid-state imaging device according to claim 15, wherein the transparent resin upper layer comprises a fluorine-based acrylic resin.

17. A solid-state imaging device according to claim 1, further comprising non-opening portion layers which cover non-opening areas existing between said plurality of microlenses; and
   at least one of the transparent resin upper layer or the thin film is made of a fluorine-based acrylic resin.

* * * * *